(12) United States Patent
Li

(10) Patent No.: US 12,150,373 B2
(45) Date of Patent: Nov. 19, 2024

(54) CARBON NANOTUBE BASED RADIO FREQUENCY DEVICES

(71) Applicant: Atom H2O, LLC, Escondido, CA (US)

(72) Inventor: Huaping Li, Los Angeles, CA (US)

(73) Assignee: Atom H2O, LLC, Escondido, CA (US)

( * ) Notice: Subject to any disclaimer, the term of this patent is extended or adjusted under 35 U.S.C. 154(b) by 573 days.

(21) Appl. No.: 17/417,719

(22) PCT Filed: Jan. 6, 2020

(86) PCT No.: PCT/US2020/012364
§ 371 (c)(1),
(2) Date: Jun. 23, 2021

(87) PCT Pub. No.: WO2020/142770
PCT Pub. Date: Jul. 9, 2020

(65) Prior Publication Data
US 2022/0077392 A1    Mar. 10, 2022

Related U.S. Application Data

(60) Provisional application No. 62/788,639, filed on Jan. 4, 2019.

(51) Int. Cl.
*H01L 51/00* (2006.01)
*C01B 32/159* (2017.01)
(Continued)

(52) U.S. Cl.
CPC ......... *H10K 71/191* (2023.02); *C01B 32/159* (2017.08); *C01B 32/168* (2017.08);
(Continued)

(58) Field of Classification Search
None
See application file for complete search history.

(56) References Cited

U.S. PATENT DOCUMENTS

| 5,180,690 A | 1/1993 | Czubatyj et al. |
| 6,682,863 B2 | 1/2004 | Rivers et al. |

(Continued)

FOREIGN PATENT DOCUMENTS

| CN | 103466591 A | 12/2013 |
| CN | 103972296 A | 8/2014 |

(Continued)

OTHER PUBLICATIONS

Lin et al., "A Cell—Compatible Conductive Film From a Carbon Nanotube Network Adsorbed on Poly-L-Lysine," ACS Nano, vol. 5 (12), p. 10026-10032 (Year: 2011).*

(Continued)

*Primary Examiner* — Asok K Sarkar
(74) *Attorney, Agent, or Firm* — KPPB LLP

(57) ABSTRACT

High-performance carbon nanotube (CNT) based millimeter-wave transistor technologies and demonstrate monolithic millimeter-wave integrated circuits (MMICs) based thereon, and methods and processes for the fabrication thereof are also provided. CNT technologies and MMICs demonstrate improved power efficiency, linearity, noise and dynamic range performance over existing GaAs, SiGe and RF-CMOS technologies. Methods and processes in CNT alignment and deposition, material contact and doping are configured to fabricate high quality CNT arrays beyond the current state-of-the-art and produce high performance RF transistors that are scalable to wafer size to enable fabrication of monolithic integrated circuits based on CNTs.

20 Claims, 25 Drawing Sheets

(51) Int. Cl.
　　　*C01B 32/168*　　(2017.01)
　　　*H01L 51/05*　　(2006.01)
　　　*H10K 10/46*　　(2023.01)
　　　*H10K 10/84*　　(2023.01)
　　　*H10K 71/00*　　(2023.01)
　　　*H10K 71/10*　　(2023.01)
　　　*H10K 85/20*　　(2023.01)

(52) U.S. Cl.
　　　CPC ............ *H10K 10/484* (2023.02); *H10K 10/84* (2023.02); *H10K 71/311* (2023.02); *H10K 85/221* (2023.02); *C01B 2202/02* (2013.01); *C01B 2202/08* (2013.01); *C01B 2202/30* (2013.01); *C01B 2202/34* (2013.01); *C01B 2202/36* (2013.01)

(56) References Cited

U.S. PATENT DOCUMENTS

| | | | |
|---|---|---|---|
| 6,919,681 B2 | 7/2005 | Cok et al. | |
| 7,064,372 B2 | 6/2006 | Duan et al. | |
| 7,253,041 B2 | 8/2007 | Gan et al. | |
| 7,381,983 B2 | 6/2008 | Bae et al. | |
| 7,537,975 B2 | 5/2009 | Moon et al. | |
| 7,907,226 B2 | 3/2011 | Yang et al. | |
| 7,932,511 B2 | 4/2011 | Duan et al. | |
| 8,232,561 B2 | 7/2012 | Rinzler et al. | |
| 8,246,928 B1 | 8/2012 | Rao et al. | |
| 8,512,668 B2 | 8/2013 | Tanaka et al. | |
| 8,715,607 B2 | 5/2014 | Liu et al. | |
| 8,860,137 B2 | 10/2014 | Zhou et al. | |
| 8,940,562 B1 | 1/2015 | Li | |
| 9,070,775 B2 | 6/2015 | Chaji et al. | |
| 9,445,421 B2 | 9/2016 | Levine et al. | |
| 9,455,421 B2 | 9/2016 | Li | |
| 9,487,002 B2 | 11/2016 | Rogers et al. | |
| 9,748,439 B2 | 8/2017 | Li et al. | |
| 10,418,595 B2 | 9/2019 | Li | |
| 10,497,888 B2 | 12/2019 | Kleemann et al. | |
| 10,541,374 B2 | 1/2020 | Li | |
| 10,665,796 B2 | 5/2020 | Li | |
| 10,847,757 B2 | 11/2020 | Li | |
| 10,957,868 B2 | 3/2021 | Luan et al. | |
| 10,978,640 B2 | 4/2021 | Li | |
| 11,069,867 B2 | 7/2021 | Li | |
| 2004/0013598 A1 | 1/2004 | McElrath et al. | |
| 2004/0252113 A1 | 12/2004 | Vicentini et al. | |
| 2005/0221016 A1 | 10/2005 | Glatkowski et al. | |
| 2006/0063460 A1 | 3/2006 | Seo | |
| 2006/0081844 A1 | 4/2006 | Hirosue et al. | |
| 2006/0110862 A1 | 5/2006 | Gan et al. | |
| 2006/0145144 A1 | 7/2006 | Lee et al. | |
| 2006/0183278 A1 | 8/2006 | Bertin et al. | |
| 2006/0261433 A1 | 11/2006 | Manohara et al. | |
| 2007/0026646 A1 | 2/2007 | Chae | |
| 2007/0246784 A1 | 10/2007 | Kang et al. | |
| 2008/0008643 A1 | 1/2008 | Landi et al. | |
| 2008/0023066 A1 | 1/2008 | Hecht et al. | |
| 2008/0143906 A1 | 6/2008 | Allemand et al. | |
| 2008/0217588 A1 | 9/2008 | Arnold et al. | |
| 2008/0286447 A1 | 11/2008 | Alden et al. | |
| 2009/0008634 A1 | 1/2009 | Tessler et al. | |
| 2009/0050879 A1 | 2/2009 | Yamaga et al. | |
| 2010/0103089 A1 | 4/2010 | Yoshida et al. | |
| 2010/0145062 A1 | 6/2010 | Li et al. | |
| 2011/0012125 A1 | 1/2011 | Nicholas et al. | |
| 2011/0036403 A1 | 2/2011 | Yoon et al. | |
| 2011/0045660 A1 | 2/2011 | Romano et al. | |
| 2011/0223095 A1 | 9/2011 | Harvey et al. | |
| 2011/0233512 A1 | 9/2011 | Yang et al. | |
| 2011/0285951 A1 | 11/2011 | Yoon et al. | |
| 2012/0062109 A1 | 3/2012 | Berry et al. | |
| 2012/0104328 A1 | 5/2012 | Park et al. | |
| 2012/0248416 A1* | 10/2012 | Zhou ............... H01L 29/1606 257/29 | |
| 2012/0256175 A1 | 10/2012 | Rinzler et al. | |
| 2012/0256296 A1 | 10/2012 | Wei et al. | |
| 2012/0280213 A1 | 11/2012 | Gau et al. | |
| 2013/0069043 A1 | 3/2013 | Friend et al. | |
| 2013/0105770 A1 | 5/2013 | Pschenitzka | |
| 2013/0108793 A1 | 5/2013 | Sivarajan et al. | |
| 2014/0209997 A1 | 7/2014 | Qian et al. | |
| 2014/0217409 A1 | 8/2014 | Chaji et al. | |
| 2014/0273379 A1 | 9/2014 | Tsai et al. | |
| 2015/0102288 A1 | 4/2015 | Hersam et al. | |
| 2015/0155430 A1 | 6/2015 | Li | |
| 2015/0202662 A1 | 7/2015 | Li | |
| 2015/0279919 A1 | 10/2015 | Zhou et al. | |
| 2015/0291429 A1* | 10/2015 | Ge ..................... B03D 3/00 494/37 | |
| 2015/0340631 A1 | 11/2015 | Rinzler et al. | |
| 2016/0043152 A1 | 2/2016 | Tian et al. | |
| 2016/0126293 A1 | 5/2016 | Li et al. | |
| 2016/0137854 A1 | 5/2016 | Heintz et al. | |
| 2016/0190170 A1 | 6/2016 | Yamazaki et al. | |
| 2016/0280547 A1 | 9/2016 | Liu et al. | |
| 2016/0359144 A1 | 12/2016 | Li | |
| 2016/0380217 A1 | 12/2016 | Afzali-Ardakani et al. | |
| 2017/0194581 A1 | 7/2017 | Li | |
| 2017/0213963 A1 | 7/2017 | Cain et al. | |
| 2018/0114934 A1 | 4/2018 | Rutherglen et al. | |
| 2018/0148337 A1 | 5/2018 | Walsh et al. | |
| 2018/0261772 A1* | 9/2018 | Arnold ............... H10K 85/221 | |
| 2018/0323387 A1 | 11/2018 | Li | |
| 2018/0323388 A1 | 11/2018 | Li | |
| 2018/0323406 A1 | 11/2018 | Li | |
| 2018/0358568 A1 | 12/2018 | Luan et al. | |
| 2019/0081259 A1 | 3/2019 | Mao | |
| 2020/0067025 A1 | 2/2020 | Li | |
| 2020/0127201 A1 | 4/2020 | Li | |
| 2020/0203644 A1 | 6/2020 | Li | |
| 2021/0032107 A1 | 2/2021 | Walsh et al. | |
| 2021/0167335 A1 | 6/2021 | Li | |

FOREIGN PATENT DOCUMENTS

| | | |
|---|---|---|
| CN | 108885967 A | 11/2018 |
| CN | 110892532 A | 3/2020 |
| CN | 111149232 A | 5/2020 |
| CN | 113632254 A | 11/2021 |
| CN | 108885967 B | 11/2023 |
| GB | 2562921 A | 11/2018 |
| GB | 2562921 B | 11/2022 |
| GB | 2610050 A | 2/2023 |
| GB | 2610050 B | 7/2023 |
| HK | 40000981 A | 2/2020 |
| HK | 40088793 A | 10/2023 |
| HK | 40088793 B | 1/2024 |
| JP | 2006108653 A | 4/2006 |
| JP | 2006240898 A | 9/2006 |
| JP | 2007031238 A | 2/2007 |
| JP | 2014150173 A | 8/2014 |
| KR | 10-2009-0100186 A | 9/2009 |
| KR | 20090112626 A | 10/2009 |
| KR | 10-2015-0063177 A | 6/2015 |
| KR | 10-2016-0070096 A | 6/2016 |
| KR | 10-2020-0005583 A | 1/2020 |
| KR | 10-2020-0024771 A | 3/2020 |
| KR | 10-2021-0134616 A | 11/2021 |
| TW | 201125808 A | 8/2011 |
| TW | 201734155 A | 10/2017 |
| TW | 1780037 B | 10/2022 |
| WO | 2008046058 A3 | 10/2008 |
| WO | 2014208896 A1 | 12/2014 |
| WO | 2015077629 A1 | 5/2015 |
| WO | 2016094580 A1 | 6/2016 |
| WO | 2017096058 A1 | 6/2017 |
| WO | 2017118093 A1 | 7/2017 |
| WO | 2017120214 A1 | 7/2017 |
| WO | 2018204870 A1 | 11/2018 |

(56) References Cited

FOREIGN PATENT DOCUMENTS

| WO | 2018208284 A1 | 11/2018 |
|---|---|---|
| WO | 2020142770 A1 | 7/2020 |

OTHER PUBLICATIONS

Tans et al., "Room-temperature transistor based on a single carbon nanotube", Nature, vol. 393, May 7, 1998, pp. 49-52.

Treacy et al., "Exceptionally high young's modulus observed for individual carbon nanotubes", Nature, vol. 381, Jun. 20, 1996, pp. 678-680, doi: 10.1038/381678a0.

Tunuguntla et al., "Enhanced water permeability and tunable ion selectivity in subnanometer carbon nanotube porins", Science, vol. 357, Aug. 25, 2017, pp. 792-796, doi: 10.1126/science.aan2438.

Wang et al., "Ultrahigh frequency carbon nanotube transistor based on a single nanotube", IEEE Transactions on Nanotechnology, vol. 6, No. 4, Jul. 2007, pp. 400-403, doi: 10.1109/TNANO.2007.901179.

Wang et al., "Wafer-scale fabrication of separated carbon nanotube thin-film transistors for display applications", Nano Letters, vol. 9, No. 12, Nov. 10, 2009, pp. 4285-4291, doi: 10.1021/nl902522f.

Wirth, "Experimental study on the aerospace applications of photoreactive nanomaterials", Thesis, UCLA, 2012, 111 Pgs.

Wu et al., "Self-assembly of semiconducting single-walled carbon nanotubes into dense, aligned rafts", Small, 2013, pp. 1-7, doi: 10.1002/smll.201301547.

Wu et al., "Top-down patterning and self-assembly for regular arrays of semiconducting single-walled carbon nanotubes", Advanced Materials, vol. 26, 2014, pp. 6151-6156, doi: 10.1002/adma.201401108.

Xia et al., "Printed sub-2 v gel-electrolyte-gated polymer transistors and circuits", Advanced Functional Materials, vol. 20, 2010, pp. 587-594, doi: 10.1002/adfm.200901845.

Xu et al., "Vertical organic light emitting transistor", Applied Physics Letters, vol. 91, Aug. 30, 2007, pp. 092991-1-092991-3, doi: 10.1063/1.2778751.

Yamauchi et al., "Fabrication of Vertical organic light-emitting transistor using ZnO thin film", Japanese Journal of Applied Physics, vol. 46, No. 4B, Apr. 24, 2007, pp. 2678-2682, doi: 10.1143/JJAP.46.2678.

Yan et al., "A high-mobility electron-transporting polymer for printed transistors", Nature, 2009, 9 Pgs, doi: 10.1038/nature07727.

Yang et al., "Control of cationic conjugated polymer performance in light emitting diodes by choice of counterion", Journal of the American Chemical Society, vol. 128, May 27, 2006, pp. 14422-14423, doi: 10.1021/ja063723c.

Young, "When Can I Get My AMOLED TV?", Information Display, vol. 10, No. 10, 2010, pp. 24-29.

Yu et al., "Microwave nanotube transistor operation at high bias", Applied Physics Letters, vol. 88, Jun. 8, 2006, pp. 233115-1-233115-3, doi: 10.1063/1.2210447.

Zaumseil et al., "Spatial control of the recombination zone in an ambipolar light-emitting organic transistor", Nature materials, vol. 5, Jan. 2006, Published Online Dec. 18, 2005, pp. 69-74, DOI: 10.1038/nmat1537.

Zhang et al., "Self-enhanced catalytic activities of functionalized graphene sheets in the combustion of nitromethane: molecular dynamic simulations by molecular reactive force field", ACS Applied Materials & Interfaces, vol. 6, Jul. 23, 2014, pp. 12235-12244. doi: 10.1021/am501562m.

Zhao et al., "Preparation of carbon-coated nano-Fe, co particles and their effects on the thermal decomposition of ammonium perchlorate", Advanced Materials Research, vols. 152-153, 2011, pp. 309-314, posted online Oct. 27, 2010, doi: 10.4028/www.scientific.net/AMR.152-153.309.

Zou et al., "Carbon nanotube driver circuit for 6x6 organic light emitting diode display", Scientific Reports, vol. 5, No. 11755, Jun. 29, 2015, pp. 1-9, DOI: 10.1038/srep11755.

Lin et al., "A novel LTPS-TFT pixel circuit compensating for TFT threshold-voltage shift and OLED degradation for Amoled", IEEE Electron Device Letters, vol. 28, No. 2, Feb. 2007, pp. 129-131, DOI: 10.1109/LED.2006.889523.

Lin et al., "Ambipolar-to-unipolar conversion of carbon nanotube transistors by gate structure engineering", Nano Letters, vol. 4, No. 5, Mar. 12, 2004, pp. 947-950, doi: 10.1021/nl049745j.

Lin et al., "The impact of scaling-down oxide thickness on Poly-Si thin-film transistors' I-V characteristics", IEEE electron device letters, vol. 15, No. 4, Apr. 1994, pp. 138-139.

Liu et al., "Large-scale single-chirality separation of single-walled carbon nanotubes by simple gel chromatography", Nature Communications, vol. 2, No. 309, May 10, 2011, pp. 1-8, DOI: 10.1038/ncomms1313.

Logdlund et al., "Theoretical-studies of the interaction between aluminum and poly(p-phenylenevinylene) and derivatives", The Journal of Chemical Physics, vol. 101, No. 5, Sep. 1, 1994, pp. 4357-4364, doi: 10.1063/1.467486.

Maehashi et al., "Electrical characterization of carbon nanotube field-effect transistors with SiNx passivation films deposited by catalytic chemical vapor deposition", Applied Physics Letters, vol. 92, May 9, 2008, pp. 183111-1-183111-3; doi:10.1063/1.2920206.

Matyba et al., "The dynamic organic p. n junction", Nature Materials, vol. 8, Aug. 2009, Published Online Jun. 21, 2009, pp. 672-676, doi: 10.1038/NMAT2478.

McCarthy et al., "Low-voltage, low-power, organic light-emitting transistors for active matrix displays", Science, vol. 332, Apr. 29, 2011, pp. 570-573, doi: 10.1126/science.1203052.

McGinnis et al., "Large-scale polymeric carbon nanotube membranes with sub-1.27-nm pores", Science Advances, vol. 4, No. e1700938, Mar. 9, 2018, 6 Pgs, doi: 10.1126/sciadv.1700938.

Meda et al., "Nano-aluminum as energetic material for rocket propellants", Materials Science and Engineering C, vol. 27, 2007, pp. 1393-1396, doi: doi:10.1016/j.msec.2006.09.030.

Meda et al., "Nano-composites for rocket solid propellants", Composites Science and Technology, vol. 65, 2005, pp. 769-773, doi:10.1016/j.compscitech.2004.10.016.

Muccini, "A bright future for organic field-effect transistors", Nature Materials, vol. 5, Aug. 2006, pp. 605-613.

Nakamura et al., "Improvement of metal-insulator-semiconductor-type organic light-emitting transistors", Japanese Journal of Applied Physics, vol. 47, No. 3, Mar. 21, 2008, pp. 1889-1893, doi: 10.1143/JJAP.47.1889.

Noh et al., "Ultra-thin polymer gate dielectrics for top-gate polymer field-effect transistors", Organic Electronics, vol. 10, 2009, Published Online Nov. 12, 2008, pp. 174-180, doi: 10.1016/j.orgel.2008.10.021.

Nomura et al., "Room-temperature fabrication of transparent flexible thin-film transistors using amorphous oxide semiconductors", Nature, vol. 432, Nov. 25, 2004, pp. 488-492, doi:10.1038/nature03090.

O'Connell et al., "Band gap fluorescence from individual single-walled carbon nanotubes", Science, vol. 297, Jul. 26, 2002, pp. 593-596.

Oh et al., "Vertical type organic transistor using C60 and its application for OLET", Molecular Crystals and Liquid Crystals, vol. 458, 2006, pp. 247-254, doi: 10.1080/15421400600932439.

Ortiz-Medina et al., "Robust water desalination membranes against degradation using high loads of carbon nanotubes", Scientific Reports, vol. 8, No. 2748, Feb. 9, 2018, 12 Pgs., doi: 10.1038/s41598-018-21192-5.

Panzer et al., "Low-voltage operation of a pentacene field-effect transistor with a polymer electrolyte gate dielectric", Applied Physics Letters, vol. 86, Feb. 28, 2005, pp. 103503-1-103503-3, DOI: 10.1063/1.1880434.

Park et al., "Enhanced luminescence in top-gate-type organic light-emitting transistors", Applied Physics Letters, vol. 85, No. 7, Aug. 16, 2004, pp. 1280-1282, DOI: 10.1063/1.1784044.

Park et al., "Flexible full color organic light emitting diode display on polyimide plastic substrate driven by amorphous indium gallium zinc oxide thin-film transistors", Applied Physics Letters, vol. 95, Jul. 6, 2009, pp. 013503-1-013503-3, doi: 10.1063/1.3159832.

(56) References Cited

OTHER PUBLICATIONS

Park et al., "High-density integration of carbon nanotubes via chemical self-assembly", Nature Nanotechnology, vol. 7, Oct. 28, 2012, pp. 787-791, doi: 10.1038/nnano.2012.189.
Park et al., "High-resolution electrohydrodynamic jet printing", Nature Materials, vol. 6, Oct. 2007, pp. 782-789, published online Aug. 5, 2007, doi: 10.1038/nmat1974.
Park et al., "Large-area assembly of densely aligned single-walled carbon nanotubes using solution shearing and their application to field-effect transistors", Advanced Materials, vol. 27, 2015, pp. 2656-2662, doi: 10.1002/adma.201405289.
Pei et al., "Polymer light-emitting electrochemical cells", Science, vol. 269, Aug. 25, 1995, pp. 1086-1088.
Perebeinos et al., "Schottky-to-ohmic crossover in carbon nanotube transistor contacts", Physical Review Letters, vol. 111, week ending Dec. 4, 2013, pp. 236802-1-236802-5, plus supplemental material, DOI: 10.1103/PhysRevLett.111.236802.
Pivkina et al., "Nanomaterials for heterogeneous combustion", Propellants, Explosives, Pyrotechnics, vol. 29, No. 1, 2004, pp. 39-48, DOI: 10.1002/prep.200400025.
Powell, "The physics of amorphous-silicon thin-film transistors", IEEE Transactions on Electron Devices, vol. 36, No. 12, Dec. 1989, pp. 2753-2763.
Rossi, "Two decades of research on nano-energetic materials", Propellants, Explosives, Pyrotechnics, vol. 39, 2014, pp. 323-327, DOI: 10.1002/prep.201480151.
Rouhi et al., "Fundamental limits on the mobility of nanotube-based semiconducting inks", Advanced Materials, vol. 23, 2011, pp. 94-99, doi: 10.1002/adma.201003281.
Rouhi et al., "High performance semiconducting nanotube inks: progress and prospects", ACS Nano, vol. 5, No. 11, Oct. 4, 2011, pp. 8471-8487, doi: 10.1021/nn201828y.
Rutherglen et al., "Nanotube electronics for radiofrequency applications", Nature Nanotechnology, vol. 4, Dec. 2009, pp. 811-819, published online Nov. 29, 2009, DOI:10.1038/NNANO.2009.355.
Sabourin et al., "Functionalized graphene sheet colloids for enhanced fuel/propellant combustion", ACS Nano, vol. 3, No. 12, Nov. 19, 2009, pp. 3945-3954, doi: 10.1021/nn901006w.
Schoppler et al., "Molar extinction coefficient of single-wall carbon nanotubes", Journal of Physical Chemistry, vol. 115, Jun. 22, 2011, pp. 14682-14686, doi: 10.1021/jp205289h.
Seo et al., "Diameter refinement of semiconducting arc discharge single-walled carbon nanotubes via density gradient ultracentrifugation", The Journal of Physical Chemistry Letters, vol. 4, Aug. 7, 2013, pp. 2805-2810, doi: 10.1021/jz4013596.
Seo et al., "Improved high-efficiency organic solar cells via incorporation of a conjugated polyelectrolyte interlayer", Journal of the American Chemical Society, vol. 133, May 10, 2011, pp. 8416-8419, doi: /10.1021/ja2037673.
Seo et al., "Improved injection in n-type organic transistors with conjugated polyelectrolytes", Journal of the American Chemical Society, vol. 131, Oct. 4, 2009, pp. 18220-18221, DOI: 10.1021/ja908441c.
Seo et al., "Solution-processed organic light-emitting transistors incorporating conjugated polyelectrolytes", Advanced Functional Materials, vol. 21, 2011, pp. 3667-3672, doi: 10.1002/adfm.201100682.
Shao et al., "Long-lifetime polymer light-emitting electrochemical cells", Advanced Materials, vol. 19, 2007, pp. 365-370, DOI: 10.1022/adma.200602087.
Shastry et al., "Large-area, electronically monodisperse, aligned single-walled carbon nanotube thin films fabricated by evaporation-driven self-assembly", Small, vol. 9, No. 1, Sep. 17, 2012, pp. 45-51, doi: 10.1002/smll.201201398.
Shulaker et al., "Carbon nanotube computer", Nature, vol. 501, Sep. 26, 2013, pp. 526-530, doi: 10.1038/nature12502.
Sirringhaus et al., "Integrated optoelectronic devices based on conjugated polymers", Science, vol. 280, Jun. 12, 1998, pp. 1741-1744, doi: 10.1126/science.280.5370.1741.
Slinker et al., "Direct measurement of the electric-field distribution in a light-emitting electrochemical cell", Nature Materials, vol. 6, Published Online Sep. 30, 2007, pp. 894-899, doi: 10.1038/nmat2021.
Smits et al., "Response of Fe powder, purified and as-produced HiPco single-walled carbon nanotubes to flash exposure", Materials Science and Engineering, vol. A358, 2003, pp. 384-389, doi:10.1016/S0921-5093(03)00282-X.
Swensen et al., "Light emission from an ambipolar semiconducting polymer field-effect transistor", Applied Physics Letters, vol. 87, Dec. 15, 2005, pp. 253511-1-253511-3, DOI: 10.1063/1.2149986.
Sze et al., "Physics of semiconductor devices", Third Edition, Wiley, Toronto, 2007, 761 Pgs.
Takahashi et al., "Carbon nanotube active-matrix backplanes for conformal electronics and sensors", Nano Letters, vol. 11, Nov. 3, 2011, pp. 5408-5413, doi: 10.1021/nl203117h.
Takizawa et al., "Effective antiscaling performance of reverse-osmosis membranes made of carbon nanotubes and polyamide nanocomposites", ACS Omega, vol. 3, Jun. 5, 2018, pp. 6047-6055, doi: 10.1021/acsomega.8b00601.
Tang et al., "Enhanced flux and electrochemical cleaning of silicate scaling on carbon nanotube-coated membrane distillation membranes treating geothermal brines", ACS Applied Materials & Interfaces, vol. 9, Oct. 13, 2017, pp. 38594-38605, doi: 10.1021/acsami.7b12615.
Tang et al., "Organic electroluminescent diodes", Applied Physics Letters, vol. 51, No. 12, Sep. 21, 1987, pp. 913-915, doi: 10.1063/1.98799.
Culp et al., "Electron tomography reveals details of the internal microstructure of desalination membranes", PNAS, vol. 115, No. 35, Aug. 28, 2018, pp. 8694-8699, doi: 10.1073/pnas.1804708115.
Dai et al., "Solution-processed, high-performance light-emitting diodes based on quantum dots", Nature, vol. 515, Nov. 6, 2014, pp. 96-99, doi:10.1038/nature13826.
Danczyk et al., "Ignition of propellants through nanostructured materials", AFRL/ RQRC Edwards AFB, CA, Mar. 2016, 27 Pgs.
De Volder et al., "Carbon nanotubes: present and future commercial applications", Science, vol. 339, Feb. 1, 2013, pp. 535-539, DOI: 10.1126/science.1222453.
Dlott, "Thinking big (and small) about energetic materials", Materials Science and Technology, vol. 22, No. 4, 2006, pp. 463-473, doi:10.1179/174328406X83987.
Drandova et al., "SiN capacitors and ESD", CS Mantech Conference, Apr. 24-27, 2006, pp. 83-86.
Dreizin, "Metal-based reactive nanomaterials", Progress in Energy and Combustion Science, vol. 35, 2009, pp. 141-167, doi:10.1016/j.pecs.2008.09.001.
Dresselhaus et al., "Raman spectroscopy on isolated single wall carbon nanotubes", Carbon, vol. 40, 2002, pp. 2043-2061.
Droudian et al., "Enhanced chemical separation by freestanding cnt-polyamide/imide nanofilm synthesized at the vapor-liquid interface", ACS Applied Materials & Interfaces, vol. 10, May 29, 2018, pp. 19305-19310, doi: 10.1021/acsami.8b02329.
Friend et al., "Electroluminescence in conjugated polymers", Nature, vol. 397, Jan. 14, 1999, pp. 121-128.
Gao et al., "Complementary logic gate arrays based on carbon nanotube network transistors", Small, vol. 9, No. 6, 2013, pp. 813-819, DOI: 10.1002/smll.201201237.
Ghosh et al., "Advanced sorting of single-walled carbon nanotubes by nonlinear density-gradient ultracentrifugation", Nature Nanotechnology, May 9, 2010, pp. 1-8, DOI: 10.1038/NNANO.2010.68.
Gu et al., "Design of flat-panel displays based on organic light emitting devices", IEEE Journal of Selected Optics in Quantum Electronics, vol. 4, No. 1, Jan./Feb. 1998, pp. 83-99.
Gundlach et al., "Pentacene organic thin-film transistors—molecular ordering and mobility", IEEE Electron Device Letters, vol. 18, No. 3, Mar. 1997, pp. 87-89.
Ha et al., "Highly uniform and stable n-type carbon nanotube transistors by using positively charged silicon nitride thin films", Nano Letters, vol. 15, 2015, published Dec. 1, 2014, pp. 392-397, dx.doi.org/10.1021/nl5037098.
Hennrich et al., "Length-sorted, large-diameter, polyfluorene-wrapped semiconducting single-walled carbon nanotubes for high-

(56) References Cited

OTHER PUBLICATIONS density, short-channel transistors", ACS Nano, Jan. 20, 2016, pp. A-H, doi: 10.1021/acsnano.5b05572.
Hinds et al., "Aligned multiwalled carbon nanotube membranes", Science, vol. 303, No. 5654, Jan. 2, 2004, pp. 62-65, doi: 10.1126/science.1092048.
Ho et al., "Molecular-scale interface engineering for polymer light-emitting diodes", Nature, vol. 404, No. 6777, Mar. 30, 2000, pp. 481-484.
Holt et al., "Fast mass transport through sub-2-nanometer carbon nanotubes", Science, vol. 312, May 19, 2006, pp. 1034-1037, doi: 10.1126/science.1126298.
Hone et al., "Thermal properties of carbon nanotubes and nanotube-based materials", Applied Physics A, vol. 74, Mar. 4, 2002, pp. 339-343, DOI: 10.1007/s003390201277.
Hoven et al., "Electron injection into organic semiconductor devices from high work function cathodes", Proceedings of the National Academy of Sciences of the United States of America, vol. 105, No. 35, Sep. 2, 2008, pp. 12730-12735, www.pnas.org/cgi/doi/10.1073/pnas.0806494105.
Hoven et al., "Ion motion in conjugated polyelectrolyte electron transporting layers", Journal of the American Chemical Society, vol. 129, 2007, pp. 10976-10977, doi: 10.1021/ja072612q.
Hsu et al., "Control of efficiency, brightness, and recombination zone in light-emitting field effect transistors", Advanced Materials, vol. 24, 2012, pp. 1171-1175, doi: 10.1002/adma.201103513.
Iechi et al., "Vertical type organic light emitting device using thin-film ZnO electrode", Synthetic Metals, vol. 154, 2005, pp. 149-152, doi:10.1016/j.synthmet.2005.07.038.
Inukai et al., "High-performance multifunctional reverse osmosis membranes obtained by carbon nanotube polyamide nanocomposite", Scientific Reports, vol. 5, No. 13562, Sep. 3, 2015, pp. 1-10, doi: 10.1038/srep13562.
Isert et al., "The effect of encapsulated nanosized catalysts on the combustion of composite solid propellants", Combustion and Flame, vol. 162, 2015, Published Online Dec. 23, 2014, pp. 1821-1828, http://dx.doi.org/10.1016/j.combustflame.2014.11.040.
Javey et al., "Ballistic carbon nanotube field-effect transistors", Nature, vol. 424, Aug. 7, 2003, pp. 654-657.
Javey et al., "High-K dielectrics for advanced carbon-nanotube transistors and logic gates", Nature Materials, vol. 1, Dec. 2002, pp. 241-245, published online Nov. 17, 2002, doi:1038/nmat769.
Javey et al., "Self-aligned ballistic molecular transistors and electrically parallel nanotube arrays", Nano Letters, vol. 4, No. 7, May 24, 2004, pp. 1319-1322, doi:10.1021/nl049222b.
Joo et al., "Dose-controlled, floating evaporative self-assembly and alignment of semiconducting carbon nanotubes from organic solvents", Langmuir, vol. 30, Mar. 2, 2014, pp. 3460-3466, doi: 10.1021/la500162x.
Kawai et al., "Self-formation of highly aligned metallic, semiconducting and single chiral single-walled carbon nanotubes assemblies via a crystal template method", Applied Physics Letters, vol. 105, 093102, Sep. 4, 2014, pp. 093102-1-093102-4, doi: 10.1063/1.4895103.
Kawai et al., "Single chirality extraction of single-wall carbon nanotubes for the encapsulation of organic molecules", Journal of the American Chemical Society, 2012, pp. A-D, doi: 10.1021/ja3013853.
Keplinger et al., "Stretchable, transparent, ionic conductors", Science, vol. 341, No. 6149, Aug. 30, 2013, pp. 984-987, doi: 10.1126/science.1240228.
Kim et al., "Electrical contacts to carbon nanotubes down to 1 nm in diameter", Applied Physics Letters, vol. 87, Oct. 17, 2005, pp. 173101-1-173101-3, DOI:10.1063/1.2108127.
Kim et al., "Polymer gate dielectric surface viscoelasticity modulates pentacene transistor performance", Science, vol. 318, Oct. 5, 2007, pp. 76-80, DOI:10.1126/science.1146458.
Kimura et al., "Low-temperature polysilicon thin-film transistor driving with integrated driver for high resolution light emitting polymer display", IEEE Transactions on Electron Devices, vol. 46, Issue 12, Dec. 1999, pp. 2282-2288.
Krupke et al., "Contacting single bundles of carbon nanotubes with alternating electric fields", Applied Physics A, vol. 76, 2002, pp. 397-400, doi: 10.1007/s00339-002-1592-4.
Kudo, "Organic light emitting transistors", Current Applied Physics, vol. 5, 2005, First Published Jun. 7, 2004, pp. 337-340, doi: 10.1016/j.cap.2003.11.095.
Li et al., "Carbon nanotube transistor operation at 2.6 GHz", Nano Letters, vol. 4, No. 4, 2004, pp. 753-756, doi: 10.1021/nl0498740.
Li et al., "Effects of ambient air and temperature on ionic gel gated single-walled carbon nanotube thin-film transistor and circuits", ACS Applied Materials & Interfaces, vol. 7, Sep. 29, 2015, pp. 22881-22887, doi: 10.1021/acsami.5b05727.
Li et al., "Electrochemical oxidations of p-doped semiconducting single-walled carbon nanotubes", Journal of Nanotechnology, vol. 2016, No. 8073593, Nov. 1, 2016, 8 Pgs, doi: 10.1155/2016/8073593.
Li et al., "Electronically pure single-chirality semiconducting single-walled carbon nanotube for large-scale electronic devices", ACS Applied Materials & Interfaces, vol. 8, Aug. 3, 2016, pp. 20527-20533.
Li et al., "Langmuir-blodgett assembly of densely aligned single-walled carbon nanotubes from bulk materials", Journal of the American Chemical Society, vol. 129, Feb. 15, 2007, pp. 4890-4891, doi: 10.1021/ja071114e.
Li et al., "Molecular design, device function and surface potential of zwitterionic electron injection layers", Journal of the American Chemical Society, vol. 131, Mar. 17, 2009, pp. 8903-8912, doi: 10.1021/ja9018836.
Li et al., "Polyfluorinated electrolyte for fully printed carbon nanotube electronics", Advanced Functional Materials, vol. 26, 2016, pp. 6914-6920, doi: 10.1002/adfm.201601605.
Li et al., "Silicon nitride gate dielectric for top-gated carbon nanotube field effect transistors", Journal of Vacuum Science & Technology B, vol. 22, No. 6, Dec. 10, 2004, pp. 3112-3114, DOI: 10.1116/1.1824048.
Li Huaping, "The effect of interface states on single-walled carbon nanotube transistors", ECS Journal of Solid State Science and Technology, vol. 5, No. 9, Aug. 5, 2016, pp. M93-M98, doi: 10.1149/2.0271609jss.
Li et al., "Transfer printing of submicrometer patterns of aligned carbon nanotubes onto functionalized electrodes", Small, vol. 3, No. 4, 2007, pp. 616-621, doi: 10.1002/smll.200600525.
Li et al., "Visualizing helical wrapping of semiconducting single-walled carbon nanotubes by surfactants and their impacts on electronic properties", Chemistry Select, vol. 1, No. 1-5, 2016, 5 Pgs, doi: 10.1002/slct.201601033.
Liang et al., "Elastomeric polymer light-emitting devices and displays", Nature Photonics, vol. 7, Oct. 2013, Published Online Sep. 22, 2013, pp. 817-824. doi: 10.1038/NPHOTON.2013.242.
Definition of "form," Merriam Webster Online, Retrieved from the Internet on Feb. 20, 2016, 12 Pgs.
International Preliminary Report on Patentability for International Application No. PCT/US2017/031619, Report issued Nov. 12, 2019, Mailed Nov. 21, 2019, 09 Pgs.
International Preliminary Report on Patentability for International Application No. PCT/US2018/031230, Report issued Nov. 5, 2019, Mailed Nov. 14, 2019, 09 Pgs.
International Preliminary Report on Patentability for International Application No. PCT/US2014/066926, Report issued May 24, 2016, Mailed Jun. 2, 2016, 13 Pgs.
International Preliminary Report on Patentability for International Application No. PCT/US2017/012161, Report issued Jul. 10, 2018, Mailed Jul. 19, 2018, 12 Pgs.
International Preliminary Report on Patentability for International Application No. PCT/US2020/012364, Report issued Jun. 16, 2021, Mailed Jul. 15, 2021, 9 Pgs.
International Search Report and Written Opinion for International Application No. PCT/US2016/064449, Search completed Mar. 17, 2017, Mailed Apr. 4, 2017, 17 Pgs.

(56) References Cited

OTHER PUBLICATIONS

International Search Report and Written Opinion for International Application No. PCT/US2017/012161, Search completed Feb. 24, 2017, Mailed May 5, 2017, 38 Pgs.
International Search Report and Written Opinion for International Application No. PCT/US2017/031619, Search completed Jul. 11, 2017, Mailed Aug. 14, 2017, 15 Pgs.
International Search Report and Written Opinion for International Application No. PCT/US2018/031230, Search completed Jul. 16, 2018, Mailed Aug. 1, 2018, 13 Pgs.
International Search Report and Written Opinion for International Application No. PCT/US2014/066926, Report Completed Feb. 2, 2015, Mailed Mar. 3, 2015, 14 Pgs.
International Search Report and Written Opinion for International Application No. PCT/US2020/012364, Report Completed on Feb. 25, 2020, Mailed Mar. 13, 2020, 10 Pgs.
"Global flat panel displays market to reach US$110 billion by 2017", Global Industry Analysts, Inc., Mar. 15, 2012, 3 Pgs.
"Large AMOLED gets a cost edge over LCD", Sector Report Display, Korea Investment & Securities Co., Ltd. Aug. 16, 2011, 32 Pgs.
"LCD TV growth improving, as plasma and CRT TV disappear", NPD DisplaySearch, Apr. 16, 2014, 2 Pgs.
"NSF protocol P248 military operations microbiological water purifiers", NSF International, Feb. 1, 2012, 3 Pgs.
"Oxide TFT production forecast to overtake LTPS in 2016", NPD DisplaySearch, Sep. 10, 2013, 4 Pgs.
"Spin coating", Wikipedia, Oct. 23, 2015; Retrieved on Jul. 11, 2017, 2 Pgs.
"Technical Bulletin Medical (TB MED) 577: Sanitary control and surveillance of field water supplies", United States Department of the Army, Dec. 15, 2005, 194 Pgs.
Almudever et al., "Variability and reliability of CNFET technology: impact of manufacturing imperfections", Microelectronics Reliability, 2014, pp. 1-9, http://dx.doi.org/10.1016/j.microrel.2014.11.011.
Antaris et al., "Probing and tailoring pH-dependent interactions between block copolymers and single-walled carbon nanotubes for density gradient sorting", Journal of Physical Chemistry C, vol. 116, Aug. 28, 2012, pp. 20103-20108, doi: 10.1021/jp3063564.
Aradhya et al., "Electrothermal bonding of carbon nanotubes to glass", Journal of The Electrochemical Society, vol. 155, No. 9, Jul. 22, 2008, pp. K161-K165.
Armstrong et al., "Enhanced propellant combustion with nanoparticles", Nano Letters, vol. 3, No. 2, Jan. 9, 2003, pp. 253-255, doi: 10.1021/nl025905k.
Arnold et al., "Sorting carbon nanotubes by electric structure using density differentiation", Nature Nanotechnology, vol. 1, Oct. 2006, pp. 60-65, doi:10.1038/nnano.2006.52.
Bachilo et al., "Structure-assigned optical spectra of single-walled carbon nanotubes", Science, vol. 298, Dec. 20, 2002, pp. 2361-2366, doi: 10.1126/science.1078727.
Badakhshan et al., "Photo-ignition of liquid fuel spray and solid rocket fuel by carbon nanotube utilizing a camera flash", Air Force Research Laboratory, Edwards AFB, CA Propulsion Dir, 2011, 22 Pgs.
Ben-Sasson et al., "Patterned electrode vertical field effect transistor fabricated using block copolymer nanotemplates", Applied Physics Letters, vol. 95, Nov. 23, 2009, pp. 213301-1-213301-3, doi:10.1063/1.3266855.
Bhat et al., "Electroluminescence in ion-gel gated conjugated polymer field-effect transistors", Chemistry of Materials, vol. 24, Oct. 7, 2012, pp. 4060-4067, doi: 10.1021/cm301610w.
Bonhommeau et al., "Raman spectroscopic investigation of individual single-walled carbon nanotubes helically wrapped by ionic, semiconducting polymers", The Journal of Physical Chemistry, vol. 117, Jun. 20, 2013, pp. 14840-14849, doi: 10.1021/jp4037606.
Brack et al., "Individual soldier / small unit desalination device", Army SBIR Solicitation, Topic No. A18-149, August 24-Oct. 24, 2018, 2 Pgs.
Brady et al., "Quasi-ballistic carbon nanotube array transistors with current density exceeding Si and GaAs", Science Advances, vol. 2, e1601240, Sep. 2, 2016, pp. 1-9, doi: 10.1126/sciadv.1601240.
Braga et al., "High-transconductance organic thin-film electrochemical transistors for driving low-voltage red-green-blue active matrix organic light-emitting devices", Advanced Functional Materials, vol. 22, 2012, pp. 1623-1631, doi: 10.1002/adfm.201102075.
Briseno et al., "Patterning organic single-crystal transistor arrays", Nature, vol. 444, Dec. 14, 2006, pp. 913-917, doi:10.1038/nature05427.
Bronikowski et al., "Gas-phase production of carbon single-walled nanotubes from carbon monoxide via the HiPco process: a parametric study", Journal of Vacuum Science & Technology A, vol. 19, No. 4, May 2, 2001, pp. 1800-1805, DOI: 10.1116/1.1380721.
Brousseau et al., "Nanometric aluminum in explosives", Propellants, Explosives, Pyrotechnics, vol. 27, 2002, pp. 300-306.
Cao et al., "Fringing-field dielectrophoretic assembly of ultrahigh-density semiconducting nanotube arrays with a self-limited pitch", Nature Communications, vol. 5, No. 5071, Sep. 26, 2014, pp. 1-7, doi: 10.1038/ncomms6071.
Cao et al., "High-performance radio frequency transistors based on diameter-separated semiconducting carbon nanotubes", Applied Physics Letters, vol. 108, No. 23, Jun. 8, 2016, pp. 233105-1-233105-5, DOI: http://dx.doi.org/10.1063/1.4953074.
Cao et al., "Improved quantum efficiency for electroluminescence in semiconducting polymers", Nature, vol. 397, Feb. 4, 1999, pp. 414-417.
Cao et al., "Medium-scale carbon nanotube thin-film integrated circuits on flexible plastic substrate", Nature, vol. 454, Jul. 24, 2008, pp. 495-500, doi:10.1038/nature07110.
Cao et al., "Radio frequency transistors using aligned semiconducting carbon nanotubes with current-gain cutoff frequency and maximum oscillation frequency simultaneously greater than 70 GHz", ACS Nano, vol. 10, Jun. 21, 2016, pp. 6782-6790, doi: 10.1021/acsnano.6b02395.
Cao et al., "Supplementary materials for carbon nanotube transistors scaled to a 40-nanometer a footprint", Science, vol. 356, No. 1369, Jun. 30, 2017, 22 Pgs., doi: 10.1126.science.aa12476.
Capelli et al., "Organic light-emitting transistors with an efficiency that outperforms the equivalent light-emitting diodes", Nature Materials, vol. 9, Jun. 2010, pp. 496-503, published online May 2, 2010, DOI:10.1038/NMAT2751.
Chaban et al., "Buckybomb: reactive molecular dynamics simulation", The Journal of Physical Chemistry Letters, vol. 6, Feb. 24, 2015, pp. 913-917, DOI: 10.1021/ acs.jpclett.5b00120.
Chang et al., "Improved electrical performance of MILC Poly-Si TFTs using CF4 plasma by etching surface of channel", IEEE Electron Device Letters, vol. 30, No. 2, Feb. 2009, pp. 130-132, doi:10.1091/LED.2008.2010064.
Chen et al., "The role of metal-nanotube contact in the performance of carbon nanotube field-effect transistors", Nano Letters, vol. 5, No. 7, Jun. 24, 2005, pp. 1497-1502, doi: 10.1021/nl0508624.
Cherenack et al., "Amorphous-silicon thin-film transistors fabricated at 300° C. on a free-standing foil substrate of clear plastic", IEEE Electron Device Letters, vol. 28, No. 11, Nov. 2007, pp. 1004-1006, DOI: 10.1109/LED.2007.907411.
Chiang et al., "Purification and characterization of single-wall carbon nanotubes (SWNTs) obtained from the gas-phase decomposition of CO (HiPco Process)", The Journal of Physical Chemistry B, vol. 105, No. 35, Aug. 10, 2001, pp. 8297-8301, doi:10.1021/jp0114891.
Cho et al., "Printable ion-gel gate dielectrics for low-voltage polymer thin-film transistors on plastic", Nature Materials, vol. 7, Nov. 2008, Published Online Oct. 19, 2008, pp. 900-906, doi: 10.1038/nmat2291.
Chortos et al., "Investigating limiting factors in stretchable all-carbon transistors for reliable stretchable electronics", ACS Nano, vol. 11, Jul. 26, 2017, pp. 7925-7937, doi: 10.1021/acsnano.7b02458.
Chortos et al., "Mechanically durable and highly stretchable transistors employing carbon nanotube semiconductor and electrodes",

(56) References Cited

OTHER PUBLICATIONS

Advanced Materials, vol. 28, 2016, pp. 4441-4448, doi: 10.1002/adma.201501828.

* cited by examiner

FIG. 4A
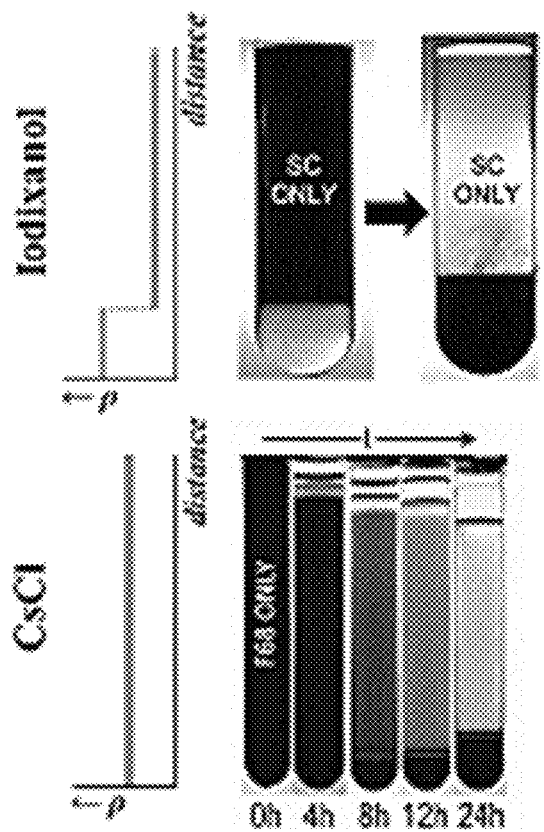
FIG. 4B
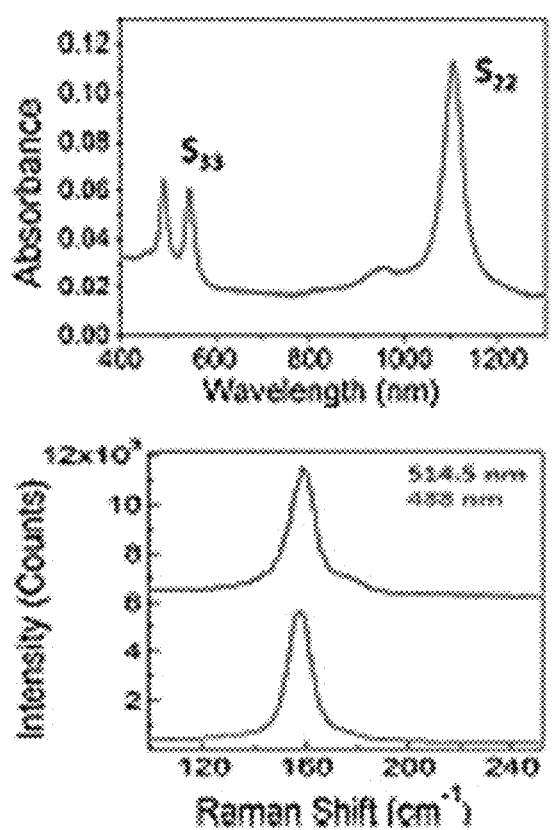
FIG. 4C

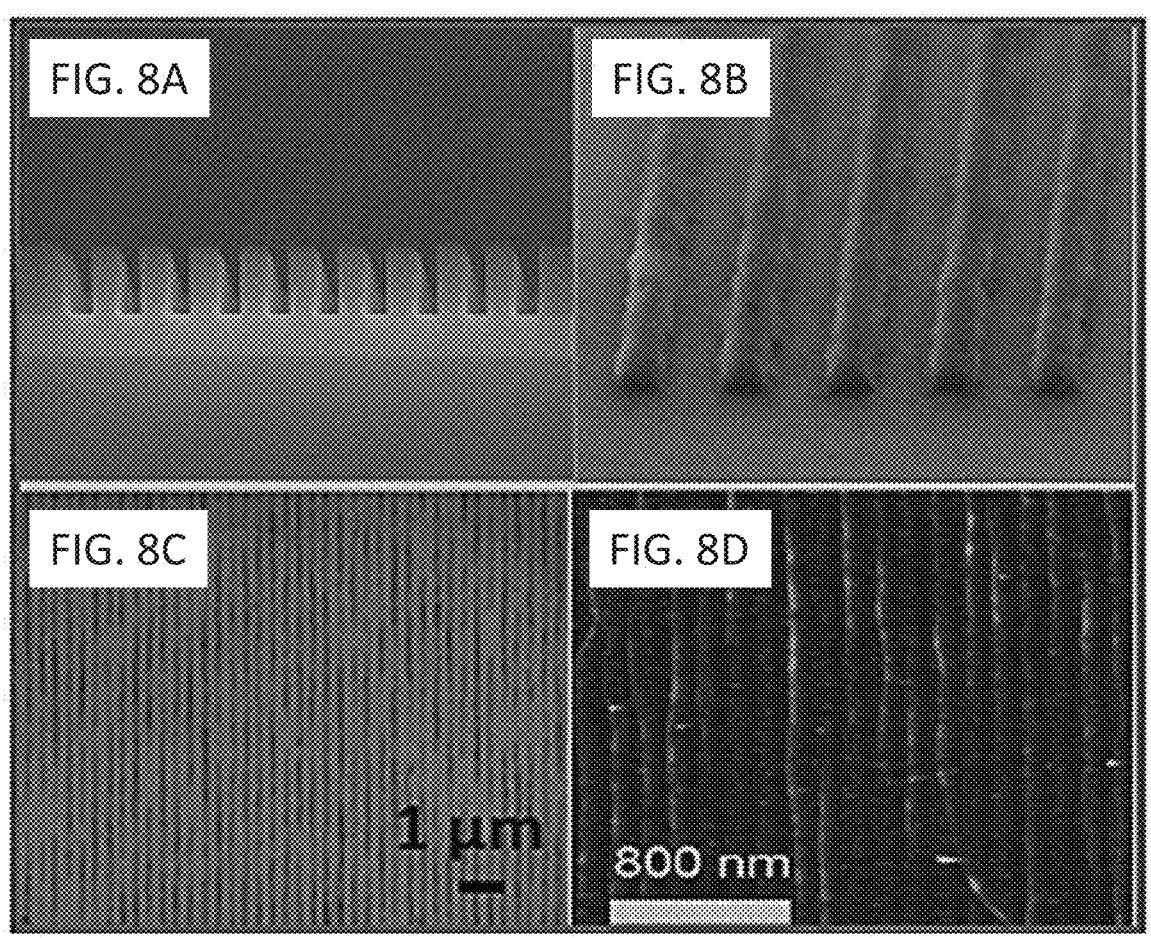

FIG. 9

Individual device Process Flow
(T-gate, Lg: 200nm)

- #1) Pattern S/D/G pre-pads/interconnection
  - E-beam & Lift off (Metal1)
  - 5 nm/60 nm Ti/Pd
  - S/D separation 1~5um
- #2) Deposit CNTs
  - CNT coating (can switch with #1)
- #3) Remove unwanted CNTs
  - Define outside openings
  - $O_2$ etching (~0.1min@60W enough)
- #4) Deposit dielectric/gate
  - E-beam (MMA/PMMA) T-shape
    * 1) Oxidation method: 140nm Al, 140°C 30min
    * 2) ALD: $Al_2O_3$ 2~10nm?
    * 3) Other dielectric $HfO_2$
- #5) Deposit gate/self-aligned S/D
  - Spin-coat interfacial CPE layer
  - Pattern SD window and lift off 10nm Pd

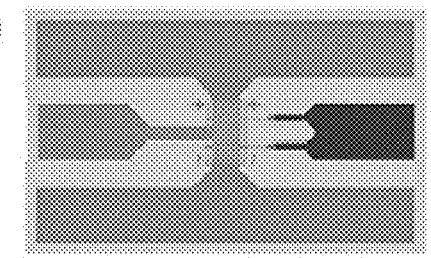
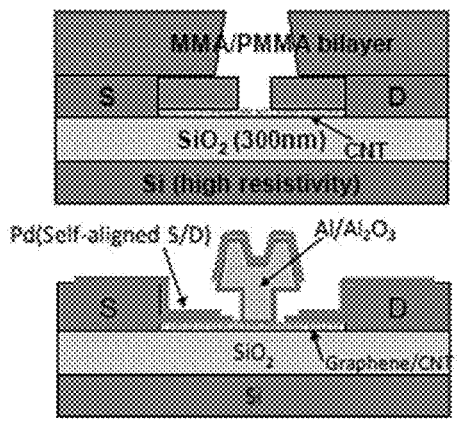

FIG. 11

Individual device Process Flow
(Embedded B-gate, Lg: 200nm)

- #1) Etch the substrate for S/D/G pre-pads
  - Dry-etch
  - Wet-etch
  - S/D separation 1~5um
- #2) Pattern S/D/G pre-pads/interconnection
  - E-beam & Lift off (Metal1)
  - 5 nm/60 nm Ti/Pd
  - S/D separation 1~5um
- #3) Deposit dielectric/gate
  - 1) Oxidation method: 140nm Al, 140°C 30min
  - 2) ALD: $Al_2O_3$ 2~10nm?
  - 3) Other dielectric $HfO_2$
- #4) Deposit CNTs
  - CNT coating (can switch with #1)
- #5) Remove unwanted CNTs
  - Define outside openings
  - $O_2$ etching (~0.1min@60W enough)
- #6) Deposit gate/self-aligned S/D
  - Spin-coat Interfacial CPE layer
  - Pattern SD window and lift off 10nm Pd

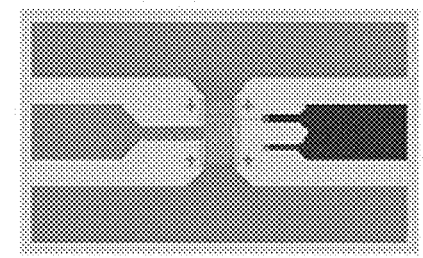

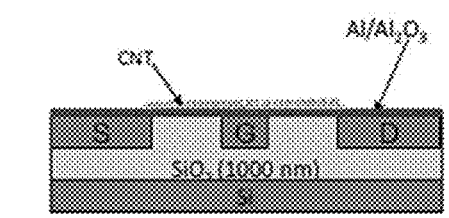

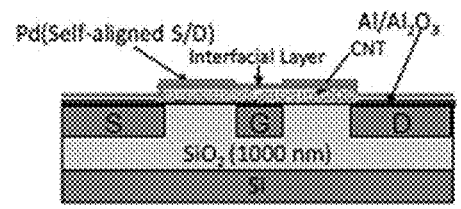

FIG. 15A  CNT Channel   FIG. 15B  CNTT-Gate
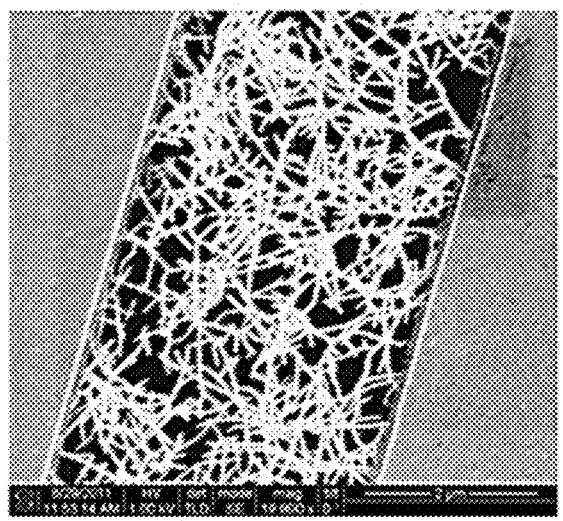
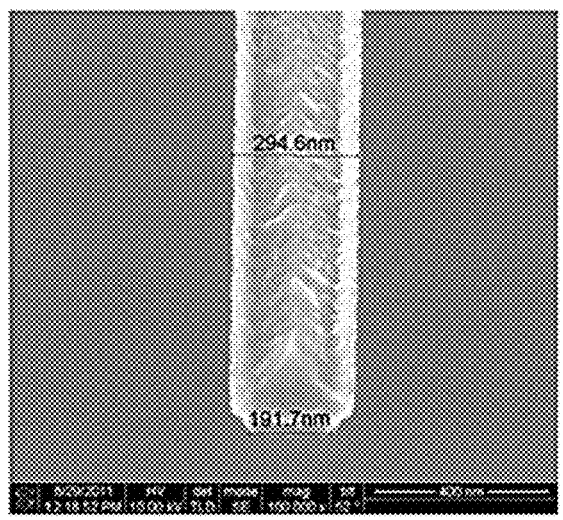
FIG. 15C  Linearity
1dB compression point (400 MHz)
FIG. 15D  RF Performance
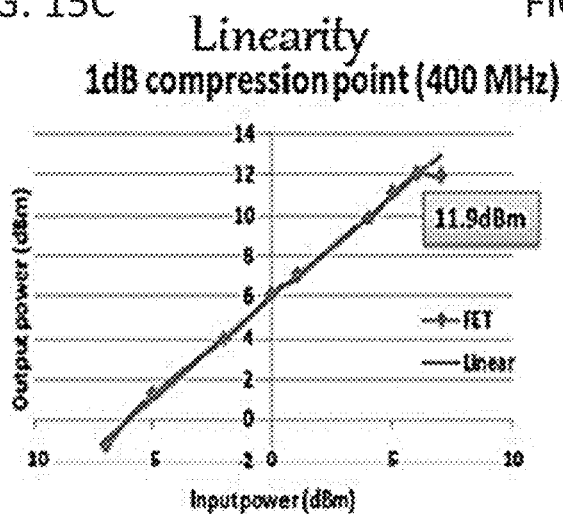
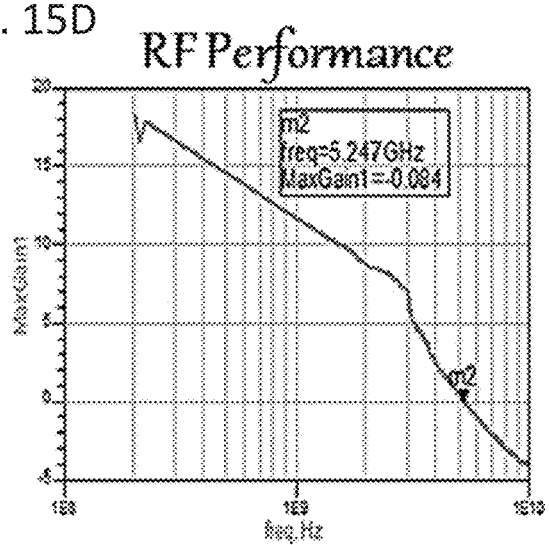

CARBON NANOTUBE BASED RADIO FREQUENCY DEVICES

CROSS-REFERENCE TO RELATED APPLICATIONS

The present application is a U.S. national stage application of PCT Application No. PCT/US2020/012364 entitled "Carbon Nanotube Based Radio Frequency Devices" to Li, filed Jan. 6, 2020, which application claims priority to U.S. Provisional Patent Application No. 62/788,639 entitled "Robust and Air Stable N-Type Carbon Nanotube Based Radio Frequency Devices" to Li, filed Jan. 4, 2019, the disclosures of which are incorporated herein by reference in their entireties.

FIELD OF THE INVENTION

The invention is generally directed to methods and systems for the fabrication of high-performance carbon nanotube (CNT) based millimeter-wave transistors and monolithic millimeter-wave integrated circuits (MMICs) and devices and apparatus based thereon.

BACKGROUND

Major drivers for commercial applications of RF power amplifiers are smartphones and tablet computers. For example, modern smartphones incorporate four to five power amplifiers, which are based on complementary metal-oxide-semiconductor (CMOS) devices with III-V compound semiconductors and silicon-on-insulator switches. The global production of wireless handsets has been steadily growing from 1.5 billion units in 2010 to more than 2 billion units in 2015, with increasing adoption of 4G technologies with time. In addition, the production of wirelessly connected tablets is growing rapidly, from 8 million units in 2010 to more than 300 million units in 2015, with a projected number over 500 million units by 2020. Other commercial markets for power amplifiers include base stations, satellite communications and GPS devices, which are predicted to require larger and faster data transmission and reception requirements. For the LTE base station market, revenue was estimated to be $600 million in 2015 and over $1.4 billion by 2020. The machine-to-machine satellite communications market was estimated to be worth about $3 billion in 2014 and is projected to reach around $4.8 billion by 2019. This represents the increasing demand for higher and faster data transmission capabilities in mobile communication and computing consumer devices. Consequently, the continued enhancement in current technology and new development of next generation prototypes of power amplifiers with a superior low power and highly linearity are required to support the increasing demand for larger data bandwidth.

SUMMARY OF THE INVENTION

In many embodiments the invention is directed to methods and systems for the fabrication of high-performance carbon nanotube (CNT) based millimeter-wave transistors and monolithic millimeter-wave integrated circuits (MMICs) and devices and apparatus based thereon.

Many embodiments are directed to carbon nanotube based radio-frequency devices including:

a substrate having disposed on a face thereof an array of parallel nanochannels;

a source and a drain electrode disposed on the substrate and defining a channel within which the nanochannels are disposed;

a plurality of individually aligned electronically pure single chirality single-walled carbon nanotubes of a narrowly-distributed diameter disposed within the nanochannels and directly bridging the channel;

a conjugated electrolyte layer disposed between the carbon nanotube array and the source and drain electrodes; and at least one gate electrode disposed within the channel.

In still many embodiments the carbon nanotubes have at least a 99% purity, a length of >1 µm, and a diameter of >0.7 nm with a distribution of diameters of ±0.1 nm.

In yet many embodiments the carbon nanotubes have a diameter of around 1.6 nm±0.1 nm.

In still yet many embodiments the carbon nanotubes are arranged within the nanochannels such that there are no point crossings between the individual carbon nanotubes.

In still yet many embodiments the nanochannels have a length of at least 1 µm and a width of 60 nm.

In still yet many embodiments the nanochannels are functionalize with poly(L-lysine).

In still yet many embodiments the carbon nanotube density is around 10 to 30 carbon nanotubes per µm.

In still yet many embodiments the gate electrode is selected from the group consisting of a T-gate, a back gate, and an embedded back gate.

In still yet many embodiments the nanochannels are formed from a PMMA material.

In still yet many embodiments the device has an ION/W>500 mA/mm, ION/IOFF>1000, $f_T$ and $f_{max}$>50 GHz, and a third-order intercept (IP3) at least 10 dB higher than its 1 dB compression power (P1 dB).

Various embodiments are directed to methods of forming a carbon nanotube based top-gated radio-frequency device including:

providing a substrate and forming a plurality of nanochannels;

disposing a plurality of individually aligned electronically pure single chirality single-walled carbon nanotubes of a narrowly-distributed diameter disposed within the nanochannels forming a carbon nanotube array;

washing the carbon nanotube array to remove unwanted carbon nanotubes;

depositing a drain pre-pad and a source pre-pad atop the carbon nanotube arrays to form a channel between said drain and said source pre-pads and such that the carbon nanotube array directly bridges said channel;

forming a dielectric gate electrode structure within the channel atop the carbon nanotube array;

depositing an interfacial conjugated electrolyte layer atop the carbon nanotube array; and depositing a set of conductive source, drain and gate electrode layers atop the drain pre-pad, source pre-pad, gate electrode structure and interfacial layer to electrically interconnect the electrodes and the carbon nanotube array.

In still various embodiments the method further includes purifying the pure single chirality single-walled carbon nanotubes by iterative gradient ultracentrifugation such that the carbon nanotubes have at least a 99% purity, a length of >1 µm, and a diameter of >0.7 nm with a distribution of diameters of ±0.1 nm.

In yet various embodiments forming the carbon nanotube array further includes:
  depositing an ebeam resistant layer atop the substrate;
  forming a plurality of nanochannels in the ebeam resistant layer by e-beam etching;
  functionalizing the channels with a poly(L-lysine) material;
  washing the functionalized channels;
  depositing a solution of the carbon nanotubes on the functionalized channels, wherein the solution is a mixture of carbon nanotubes dispersed by one or more surfactants;
  baking the substrate;
  washing the baked substrate to remove excess carbon nanotubes; and
  removing the ebeam resistant material from the substrate.

In still yet various embodiments the surfactants are sodium cholate and sodium dodecyl sulfonate.

In still yet various embodiments the carbon nanotubes are arranged within the nanochannels such that there are no point crossings between the individual carbon nanotubes.

Some embodiments are directed to methods of forming a carbon nanotube based back-gated radio-frequency device comprising:
  providing a substrate and forming a drain, a source and a gate pre-pad thereon to define a channel;
  depositing a layer of dielectric atop the pre-pads;
  forming a plurality of nanochannels atop the dielectric layer and disposing a plurality of individually aligned electronically pure single chirality single-walled carbon nanotubes of a narrowly-distributed diameter disposed within the nanochannels forming a carbon nanotube array that directly bridges said channel;
  washing the carbon nanotube array to remove unwanted carbon nanotubes;
  depositing an interfacial conjugated electrolyte layer atop the carbon nanotube array; and
  depositing a set of conductive source, drain and gate electrode layers atop the drain pre-pad, source pre-pad, and interfacial layer to electrically interconnect the electrodes and the carbon nanotube array.

In still some embodiments the method further includes purifying the pure single chirality single-walled carbon nanotubes by iterative gradient ultracentrifugation such that the carbon nanotubes have at least a 99% purity, a length of >1 μm, and a diameter of >0.7 nm with a distribution of diameters of ±0.1 nm.

In yet some embodiments forming the carbon nanotube array further includes:
  depositing an ebeam resistant layer atop the dielectric layer;
  forming a plurality of nanochannels in the ebeam resistant layer by e-beam etching;
  functionalizing the channels with a poly(L-lysine) material;
  washing the functionalized channels;
  depositing a solution of the carbon nanotubes on the functionalized channels, wherein the solution is a mixture of carbon nanotubes dispersed by one or more surfactants;
  baking the substrate;
  washing the baked substrate to remove excess carbon nanotubes; and
  removing the ebeam resistant material from the substrate.

In still yet some embodiments the surfactants are sodium cholate and sodium dodecyl sulfonate.

In still yet some embodiments the carbon nanotubes are arranged within the nanochannels such that there are no point crossings between the individual carbon nanotubes.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

The description and claims will be more fully understood with reference to the following figures and data graphs, which are presented as exemplary embodiments of the invention and should not be construed as a complete recitation of the scope of the invention.

FIG. 4A provides a process diagram of a purification process for carbon nanotubes in accordance with various embodiments of the invention.

FIGS. 4B to 4E provide spectra of purified carbon nanotubes in accordance with various embodiments of the invention.

FIGS. 8A to 8D provide images of carbon nanotube arrays in accordance with various embodiments of the invention.

FIG. 9 provides a process flowchart for a process for forming top-gate CNT RF FET devices in accordance with various embodiments of the invention.

FIG. 11 provides a process flowchart for a process for forming back-gate CNT RF FET devices in accordance with various embodiments of the invention.

FIGS. 15A to 15D provide: 15A) SEM image of CNT inside source-drain contact; 15B) SEM of a T-gate; 15C) the 1 dB compression of a T-gate CNT RF device; and 15D) typical $f_{MAX}$ results of a T-gate CNT RF device, all in accordance with various embodiments of the invention.

DETAILED DESCRIPTION

Figure 1A:
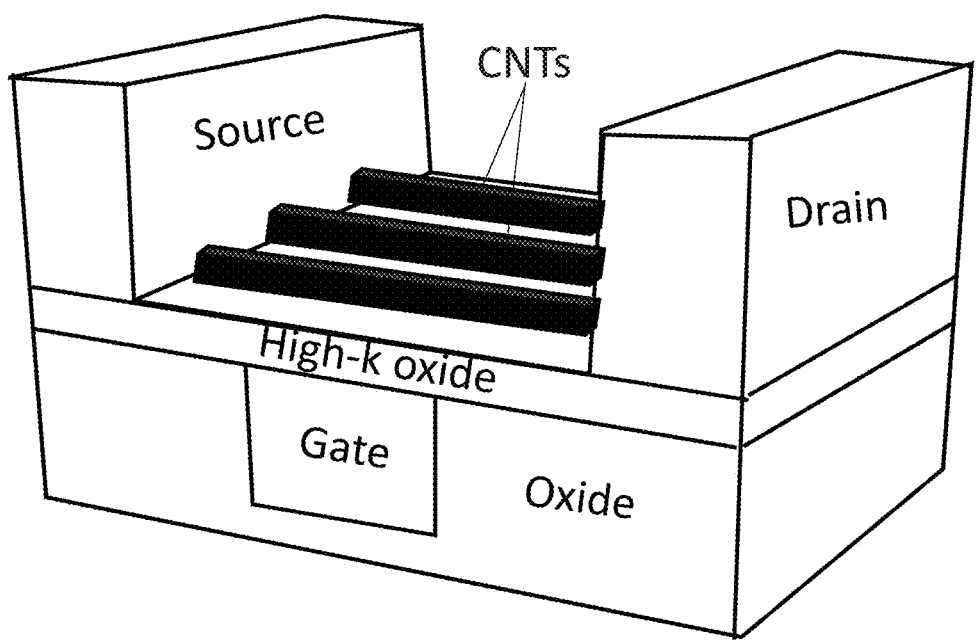
FIG. 1A illustrates a carbon nanotube based RF device in accordance with various embodiments of the invention.

Turning now to the drawings and data, embodiments of the invention are generally directed to high-performance carbon nanotube (CNT) based millimeter-wave transistor technologies and demonstrate monolithic millimeter-wave integrated circuits (MMICs) based thereon, and methods and processes for the fabrication thereof. Various embodiments of such CNT technologies and MMICs demonstrate improved power efficiency, linearity, noise and dynamic range performance over existing GaAs, SiGe and RF-CMOS technologies. High-performance CNT-based transistor technologies and wafer-scale monolithic integrated circuits at millimeter-wave frequencies according to embodiments are capable of being commercialized to outperform incumbent semiconductor high frequency technologies (GaAs, SiGe, RF-CMOS) at much lower cost. Embodiments of methods and processes in CNT alignment and deposition, material contact and doping are configured to fabricate high quality CNT arrays beyond the current state-of-the-art. Such embodiments also establish robust processes capable of producing high performance RF transistors that are scalable to wafer size to enable fabrication of monolithic integrated circuits based on CNTs.

Semiconducting single-walled carbon nanotubes (CNTs) have very desirable characteristics which are ideal for field-effect transistor (FET) channels, such as one-dimensional (1D) ballistic transport, high carrier mobility, inherent linearity and small size. Single-CNT FETs with room temperature ballistic transport approaching the quantum conductance limit ($2G_o$=4e2/h=155 uS) were demonstrated more than a decade ago. (See, e.g., Javey, A., et al., Nature 2003, 424, 654-657, the disclosure of which is incorporated herein by reference.) Based on extrapolation from individual CNT characteristics, it was predicted that FETs consisting of parallel arrays of CNTs would lead to significant improvement in energy-delay and therefore speed and power consumption for logic devices, and enhanced linearity and efficiency for RF applications. Such an enabling technology would have a major impact in reducing the size, weight, power and cost (SWAP-C) of electronic components. However, this potential has not been fully realized due to a number of technical challenges: 1) the lack of techniques to eliminate tube-to-tube cross junctions and achieve parallel aligned CNT arrays with optimal packing density of CNTs; 2) the presence of metallic CNTs leading to less than ideal semiconducting purity; and 3) the difficulty in creating highly conductive Ohmic contact to the CNT arrays.

A number of recent developments have made significant progress in overcoming the challenges in sorting, processing, alignment and contacts of CNT arrays, and have led to CNT FETs that can outperform conventional Si and GaAs FETs. (See, e.g., G. J. Brady, et al., Sci. Adv. 2016; 2:e1601240, the disclosure of which is incorporated herein by reference.) For the first time, aligned parallel CNT arrays with higher than 99.98% semiconducting purity were realized on Silicon and quartz substrates.

FETs built using these CNT arrays have realized room-temperature quasi-ballistic transport with channel conductance approaching the quantum conductance limit and 7 times higher than previous state-of-the-art CNT array FETs. Furthermore, high frequency FETs using well aligned CNT arrays deposited on quartz substrates have achieved current-gain cutoff frequency ($f_t$) and maximum oscillation frequency ($f_{max}$) greater than 70 GHz. (See, e.g., Y. Cao, et al., ACS Nano, vol. 10, pp. 6782-6790, 2016, the disclosure of which is incorporated herein by reference.)

While these breakthroughs in device performance offer the opportunity to finally utilize one-dimensional (1D) transport properties of thousands of aligned, gate-controllable conduction pathways possessing linear current density characteristics for improving high-frequency circuit performance, CNT FETs have only been demonstrated for microwave frequencies. Thus far CNT FETs have not been demonstrated for millimeter-wave frequencies and higher. Embodiments are directed to CNT FETS demonstrating higher $f_t$ and $f_{max}$ (e.g., greater than 100 GHz), and improved array purity, alignment and contact resistance. Embodiments are also directed to high-performance CNT-based transistor technology and wafer-scale monolithic integrated circuits at millimeter-wave frequencies capable of outperforming incumbent semiconductor high frequency technologies (GaAs, SiGe, RF-CMOS) at lower cost. Embodiments are also directed to methods and processes for CNT alignment and deposition, material contact and doping capable of creating high quality CNT arrays, and producing environmentally stable high performance RF transistors based on such CNTs. Embodiments of methods and processes are scalable to wafer size to enable fabrication of monolithic integrated circuits. High performance carbon nanotube RD FETs according to embodiments will also have advantages in simple fabrication, high data transit rate, low power consumption, long battery lifetime and low cost, which will allow for use in wireless communications such as mobile, GPS, WIFI, garage door remotes, radio, and television (satellite and broadcast).

Specifically, to keep up with the ever-demanding technology requirements of such products RF chip technology must evolve to push the envelope on cost and performance. Embodiments will allow for the fabrication of electronics capable to being used in smartphones and emerging mobile communication markets with an integrated RF transceiver chip with various radios (LTE, WCDMA, WiMAX, WiFi, and others) founded on superior device technology using CNT FETs with superior performance as the results of "ballistic transport". Broader impacts include (1) pin-to-pin drop in replacement RF transistors for radio communication products, (2) discrete power amplifier modules for base stations and emerging femtocell trends (3) advanced mm-wave communication and imaging 25 to 250 GHz and (4) integrated approaches for 5G advanced features such as pervasive networking and cognitive radio.

Embodiments go beyond traditional semiconductor device solutions based on Si and III-V by evoking ballistic transport regimes in one dimensional nanomaterials such as carbon nanotubes (CNT). Ballistic device transport allows for ultimate device efficiency and spectral linearity to accommodate for 5G interference averaging techniques such as frequency hopping where spectral efficiency, filter technology and interference cancellation is falling short. RF CNT devices according to embodiments have the potential to offer higher bandwidth (GHz operation towards THz), improved linearity (less radio elements and filtering demands), higher efficiency (increased battery life) and compatibility with existing CMOS integration processes (reduced cost).

Embodiments Implementing CNT RF Devices

Figure 1B:
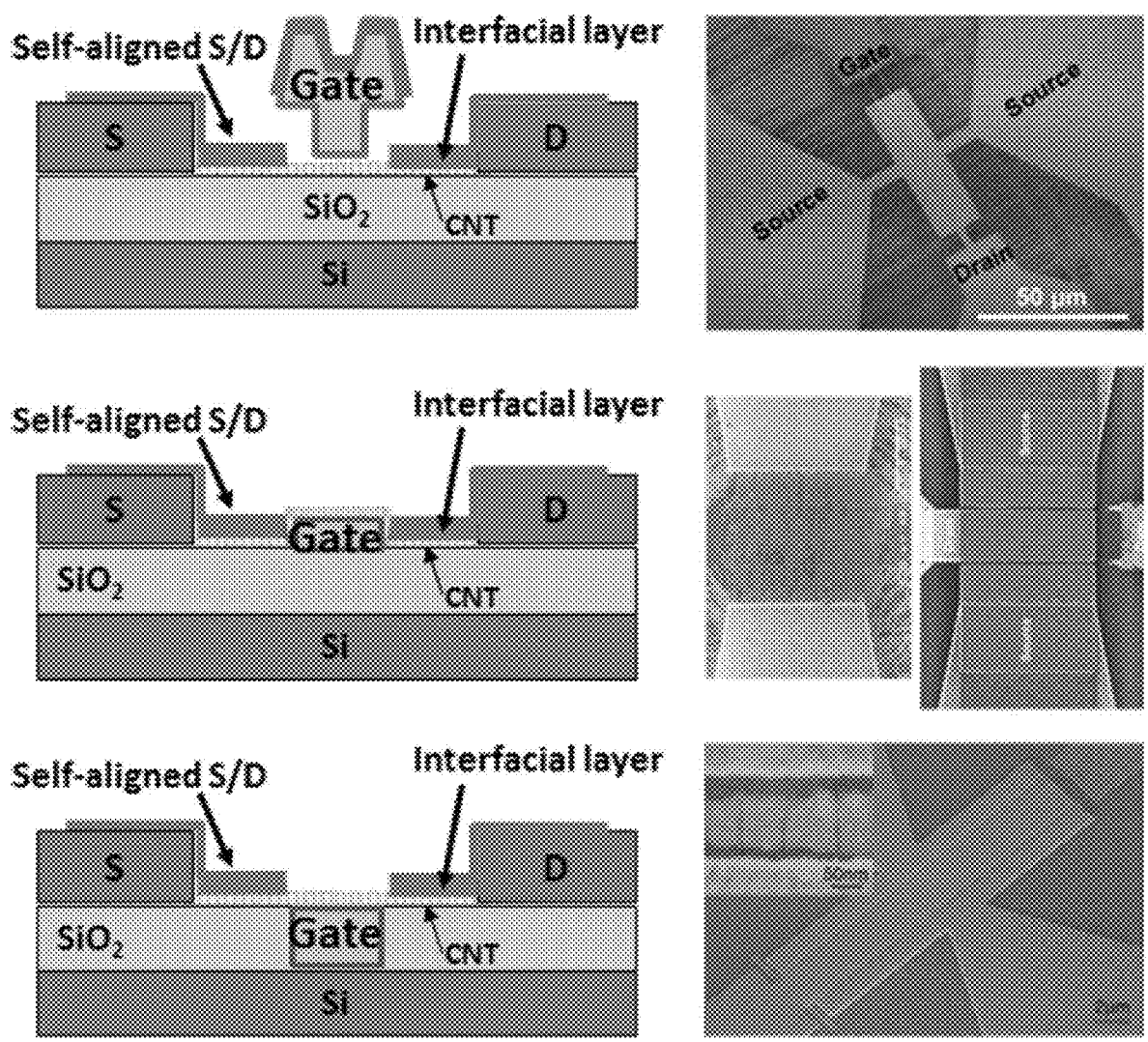
FIG. 1B illustrates carbon nanotube based RF devices with top-gate (top), back-gate (middle), and embedded back-gate (bottom) in accordance with various embodiments of the invention.

Embodiments implement carbon nanotube enabled RF devices, such as for example TFT RF devices. Many such embodiments implement a device architecture, as generally shown in FIG. 1A, comprising the following elements:
A substrate formed of a suitable substrate material such as, for example, quartz, glass, silicon, oxides, etc.
Source and drain electrode prepads disposed on the substrate defining a gap therebetween.
A gate electrode disposed within the gap and disposed in one of either a top (FIG. 1B, top), back (FIG. 1B, middle) or embedded back (FIG. 1B, bottom) configuration.
An array of nano-scale channels formed into the substrate and bridging the gap between the drain/source electrodes, and having disposed therein individually aligned single-chirality semiconducting single-walled carbon nanotubes.
A conjugated polyelectrolyte interfacial layer disposed between the carbon nanotube array and the source/drain electrodes (FIG. 2A) to reduce contact resistance (e.g., from 120 kΩ per carbon nanotube to 3 kΩ per carbon nanotube) thus improving carrier injection as demonstrated with fully printed devices and photolithography fabricated devices (see, e.g., FIGS. 2B & 2C).

Embodiments provide functional millimeter wave monolithic integrated circuits that exceed GaAs, SiGe, RF-CMOS in DC and RF metrics through a hysteresis-free CMOS compatible process flow which can be integrated into an existing commercial CMOS process. CNT RF transistors and CMOS circuits according to such embodiments demonstrate the following metrics (as summarized in FIGS. 3A to 3H):
DC: ION/W>500 mA/mm, ION/IOFF>1000, and in some embodiments ION/W>700 mA/mm, gm/W>700 mS/mm;
RF: $f_T$ and $f_{max}$>50 GHz, and in some embodiments $f_T$>130 GHz, $f_{max}$>180 GHz;
a third-order intercept (IP3) at least 10 dB higher than its 1 dB compression power (P1 dB), and in some embodiments at least 15 dB higher than its 1 dB compression power (P1 dB).

Figure 3A:
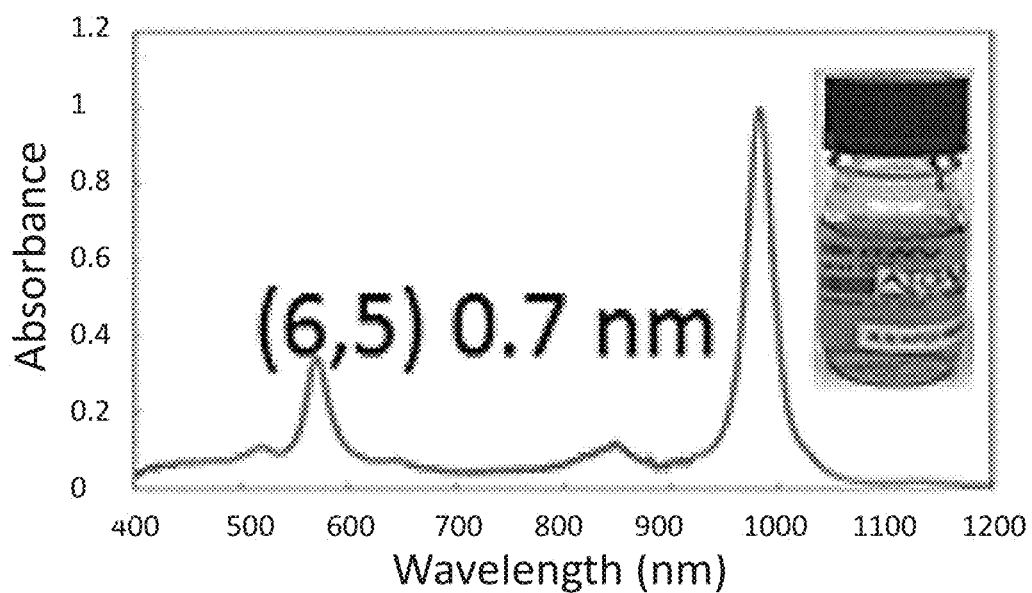
FIGS. 3A and 3B provide data showing spectra for high purity carbon nanotubes in accordance with various embodiments of the invention.
Figure 3B:
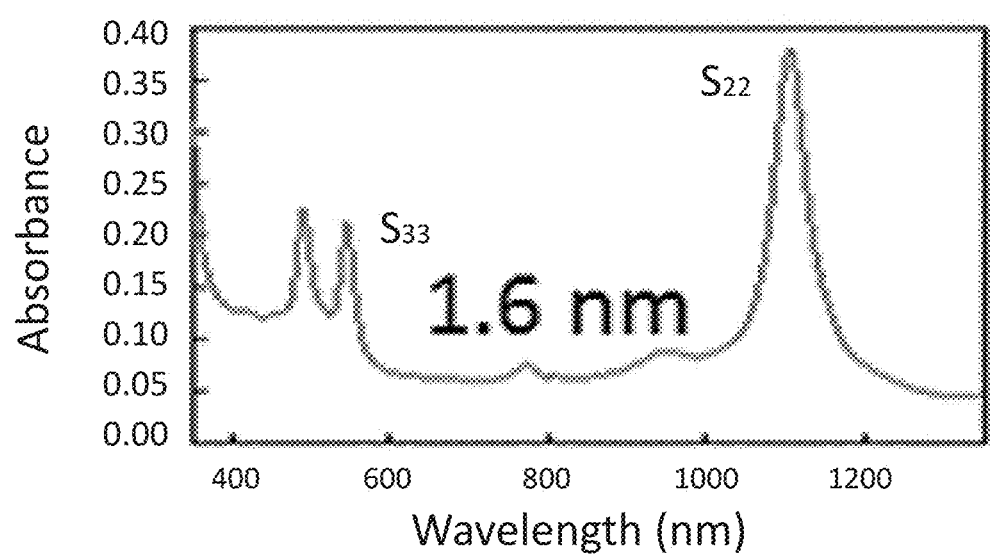
Figure 3C:
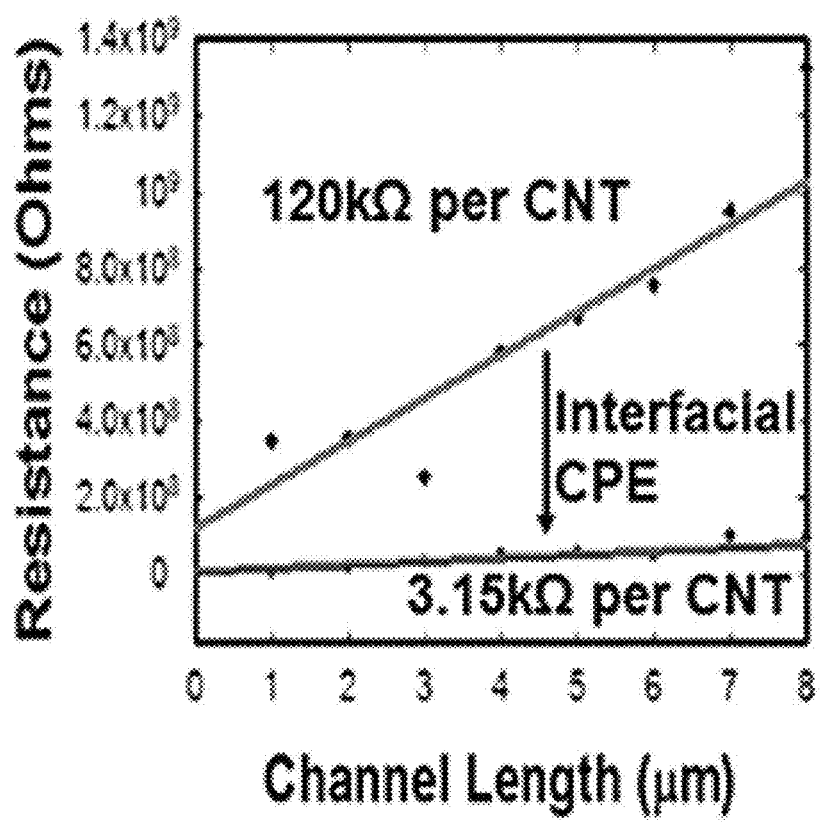
FIG. 3C provides data showing resistance versus channel length for carbon nanotubes in accordance with various embodiments of the invention.
Figure 3D:
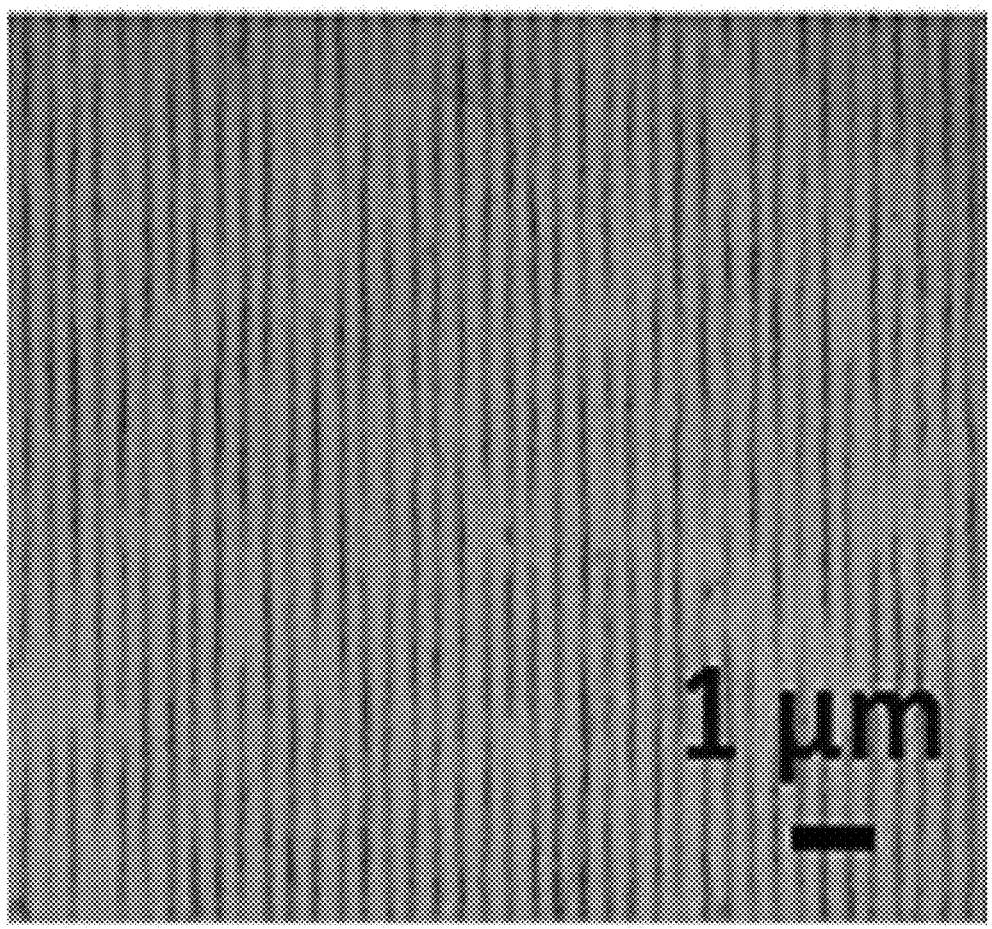
FIG. 3D provides an image of a carbon nanotube array in accordance with various embodiments of the invention.
Figure 3E:
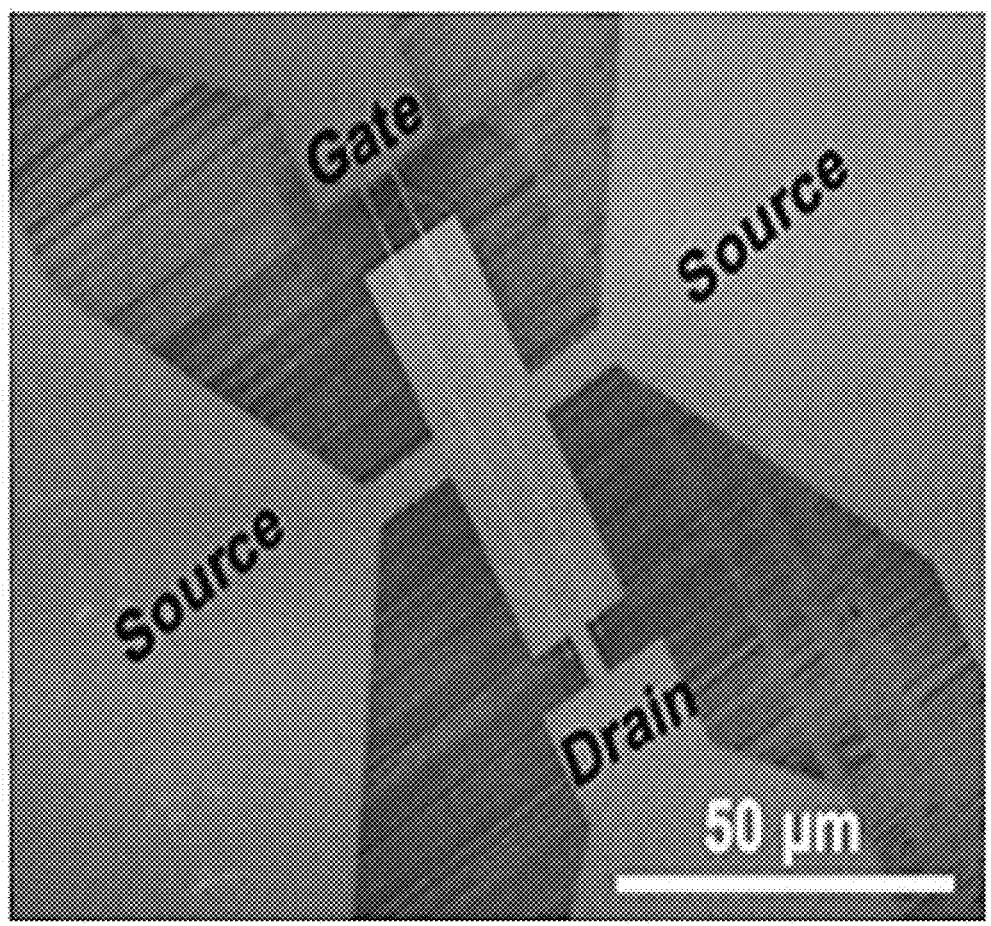
FIG. 3E provides an image of an exemplary CNT RF FET device in accordance with various embodiments of the invention.
Figure 3F:
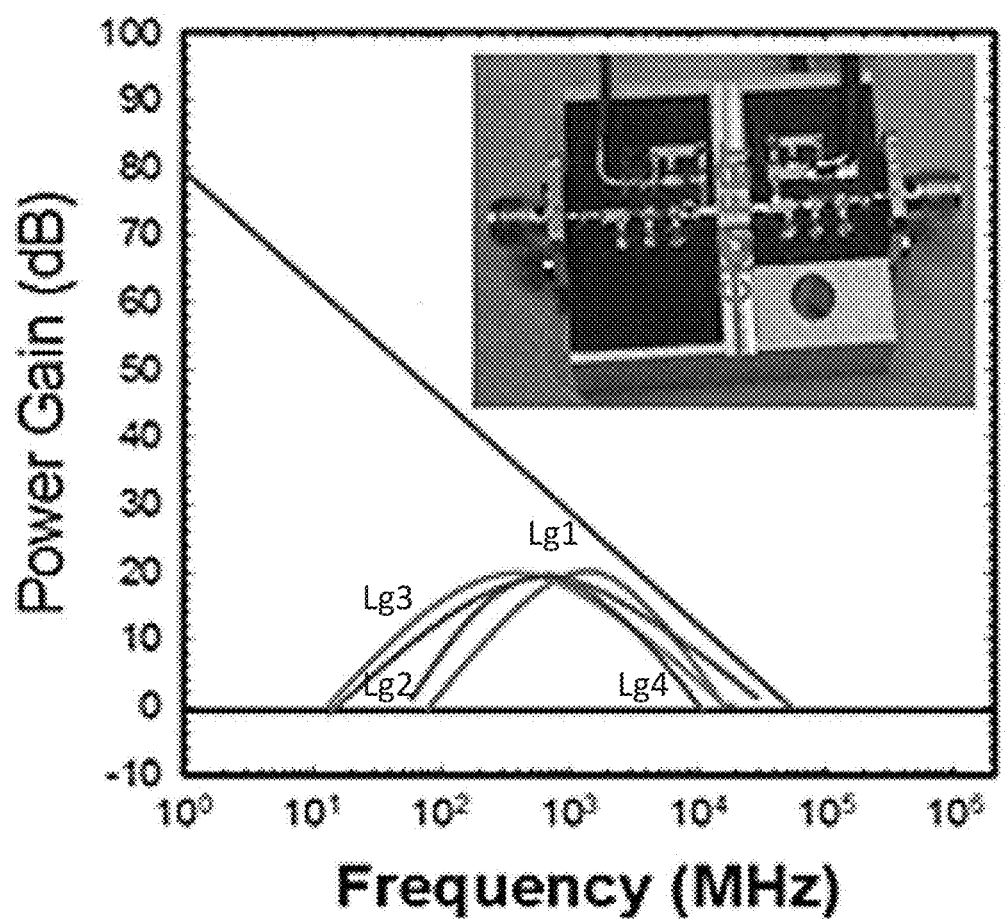
FIG. 3F provides data of power gain and frequency for an exemplary CNT RF FET device in accordance with various embodiments of the invention.
Figure 3G:
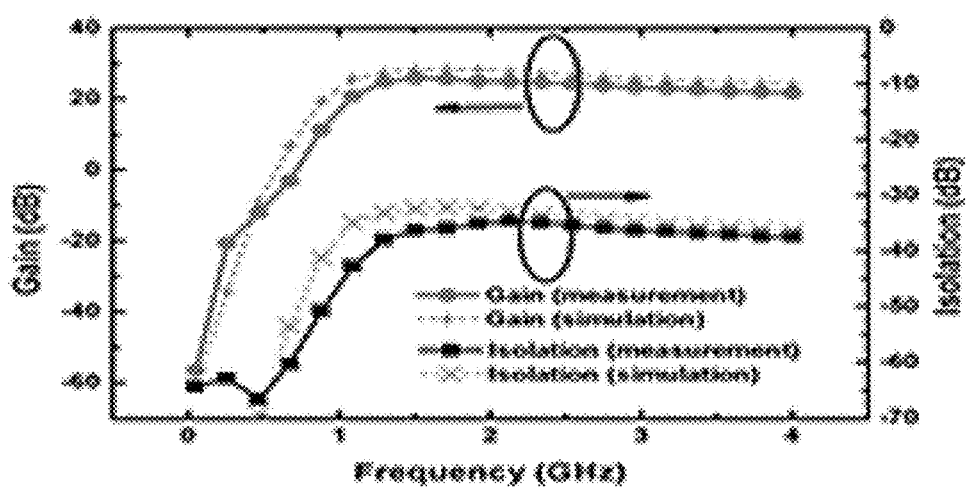
FIG. 3G provides gain data for an exemplary CNT RF FET device in accordance with various embodiments of the invention.
Figure 3H:
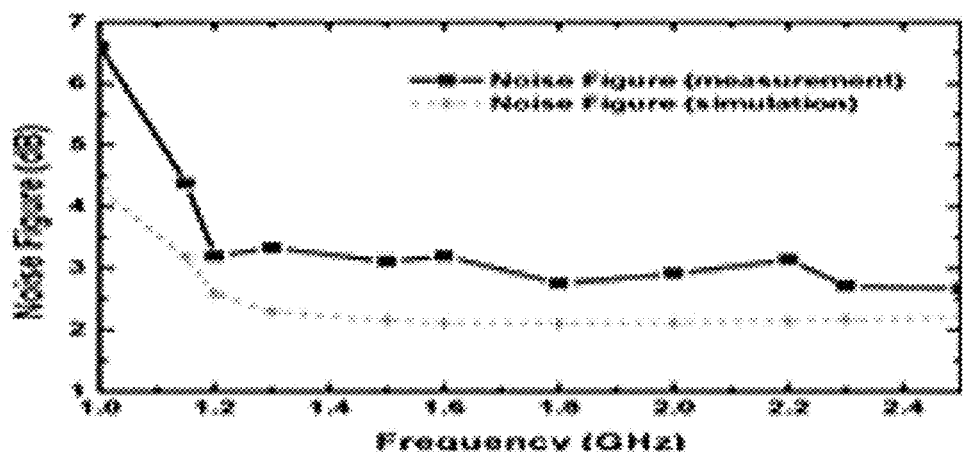
FIG. 3H provide noise data of noise for an exemplary CNT RF FET device in accordance with various embodiments of the invention.

Utilizing such CNT enabled devices, any number of functional circuits may be designed including low noise amplifiers with noise figures less than 2 dB, and power amplifiers with output powers greater than 30 dBm, in the embodiments shown in FIGS. 3G and 3H, both operating at 30 GHz. Due to the inherent linearity of carbon nanotube FETs, high performance RF devices can be widely used in RF front-ends for low-noise amplifiers, mixers, and power amplifiers.

As will be described in greater detail below, to form RF devices capable of demonstrating the desired performance metrics, embodiments implement a number of specific processes and design configurations.

Embodiments Implementing Electronically Pure SWCNT Fabrication Methods

Embodiments incorporate large scale separation methods to produce electronically pure single chirality (e.g., (6,5)) SWCNT. In many such embodiments the CNTs demonstrate a narrow-distributed large diameter semiconducting carbon nanotubes (e.g., >0.7 nm and in some ~1.6 nm±0.1 nm). Such large diameter carbon nanotubes, according to such embodiments, exhibit high transconductance.

Due to the polydispersity of carbon nanotubes in large diameters, their electrical properties usually vary from devices to devices. Increasing with diameters, the number of index (m,n) to form carbon nanotubes increases. Thus the chirality differentiation becomes less and the abundance of each chirality is low. Overall, it is much more challenging to isolate single chirality in large diameter than small diameter carbon nanotubes. Various embodiments thus implement large scale sorting methods for narrowly-distributed large diameter semiconducting single-walled carbon nanotubes (~1.6 nm±0.1 nm). Many such embodiments implement single-walled carbon nanotube purification using a self-forming gradient ultracentrifugation (see, e.g., Seo, J.-W. T. et al., *The Journal of Physical Chemistry Letters*, vol. 4, pp. 2805-2810, 2013, the disclosure of which is incorporated herein by reference), and in some embodiments iterative density gradient ultracentrifugation (i-DGU) approach (See, e.g., Kawai, M. et al., The Journal of American Chemical Society, vol. 134, pp. 9545-9548, 2012, the disclosure of which is incorporated herein by reference). In some such embodiments, carbon nanotubes with large diameters are pre-enriched with chromatography.

Figure 4D:
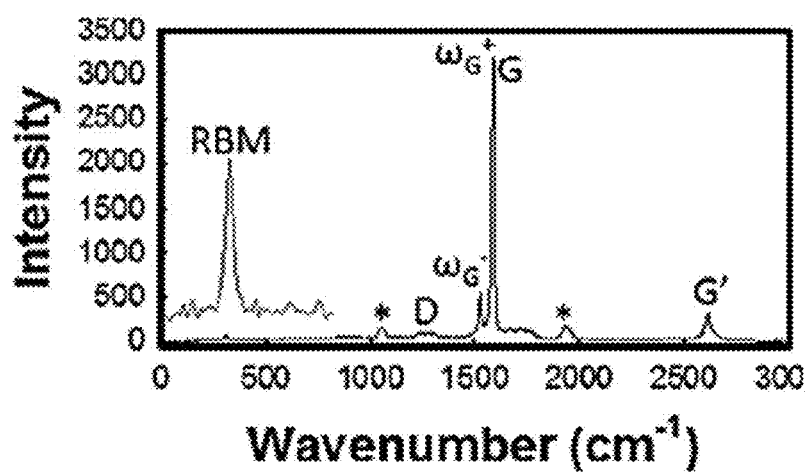
Figure 4E:
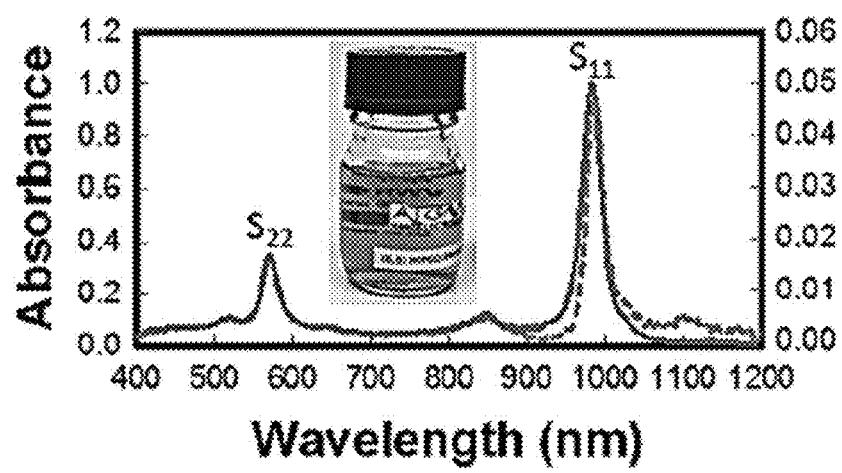

More specifically, embodiments use an i-DGU process with single or dual surfactant and homogeneous loading of density gradient medium per iteration will be developed (FIGS. 4A to 4C). Various embodiments utilize one step gradient (iodixanol as density gradient medium) and sodium cholate (SC) as the sole surfactant in the first iteration to isolate well individualized population of semiconducting carbon nanotubes with diameters that are relatively larger than the rest of species. The diameter distribution of carbon nanotubes with larger diameter may be further narrowed in a CsCl medium (a self-forming density gradient) by either exchanging the surfactant to Pluronic block copolymer F68 or by adding sodium dodecyl sulfate as the co-surfactant to SC. The exchange of surfactants and density gradient medium between the two iterations in such embodiments may be accomplished by temporary aggregation of SC-individualized semiconducting SWCNTs via scalable processes involving organic solvent mixing, filtration and rinsing, followed by re-dispersion in CsCl and F68-based aqueous solution. For the co-surfactant approach, the SC-individualized SWCNTs may be further dialyzed to minimize the concentration of iodixanol and will be simply added to CsCl and SC/SDS-based aqueous solution.

Self-forming density gradient ultracentrifugation with F68, according to embodiments, provides a scalable and fast method of sorting SWCNTs with large diameter range of 1.2-1.6 nm by their electronic type with high yield. Furthermore, CsCl generates much gentler density slope than iodixanol, and thus provides higher resolution of separation required to isolate each diameter species of SWCNTs with subtle buoyant density differences. According to embodiments, this second iteration of i-DGU will separate and enable the extraction of well-individualized s-SWCNTs from the first iteration with the lowest buoyant densities and narrow distribution of diameters. The use of step and self-forming density gradients, in accordance with embodiments, precludes the requirement for linear density gradients and the associated equipment, efforts, and preparation time, while maximizing the yield by allowing the entire gradients to be loaded with CNTs, thus beneficial for scale-up.

Using such processes and methods, the purity of separated large diameter semiconducting single-walled carbon nanotubes will be >99%. The diameter distribution according to various embodiments will be ~1.6 nm±0.1 nm in a quantity of separated large diameter SWCNTs of 1 liter of solution with concentration of 0.01 mg/ml per day.

Large diameter carbon nanotubes have exhibited larger transconductance than small diameter ones. (See, e.g., Chen, Z. et al., Nano Letters, vol. 5, pp. 1497-1502, 2005; and Tersoff, J. et al., Physical Review Letters, vol. 111, pp. 236802, 2013, the disclosures of which are incorporated herein by reference.) For RF applications according to embodiments, semiconducting carbon nanotubes with a diameter of ~1.6 nm may provide an average bandgap of ≈0.55 eV. For these energy level carbon nanotubes, carriers are believed to transport at the CNT surface along the tube axis direction, with significantly reduced scattering probability. More recently, the CNT RF FETs fabricated with narrowly distributed large diameter CNTs (~1.6i nm) showed the extrinsic $f_T$ and $f_{MAX}$ of 23 GHz and 20 GHz, respectively.

The purity and chiralities of separated s-SWCNTs may be identified using Vis-NIR absorption, NIR luminescence and Raman spectroscopy (see, e.g., FIGS. 4B to 4E).

Figure 4F:
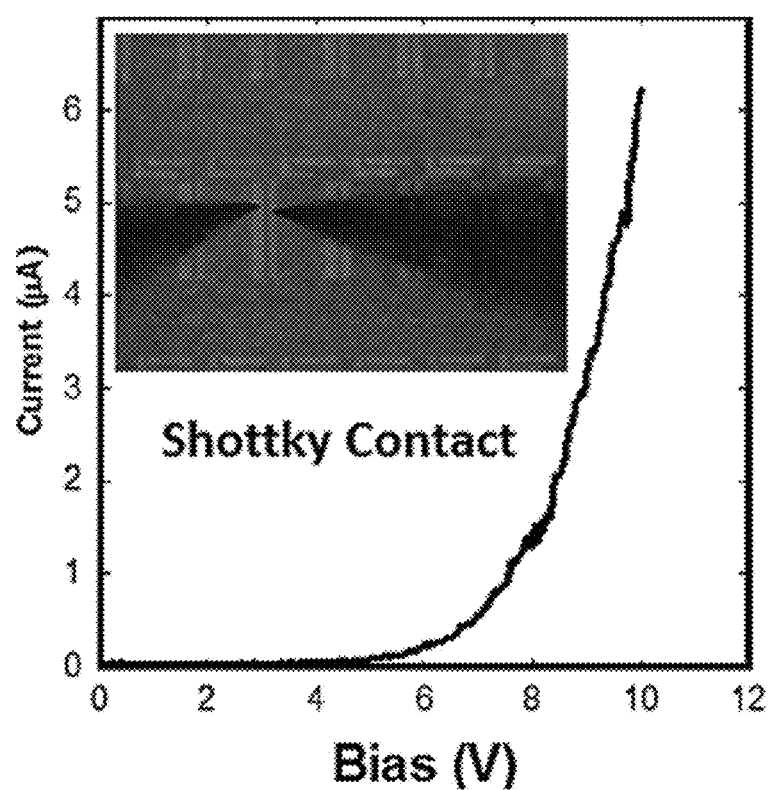
FIG. 4F provides data of current versus bias for a Shottky contact in accordance with various embodiments of the invention.
Figure 4G:
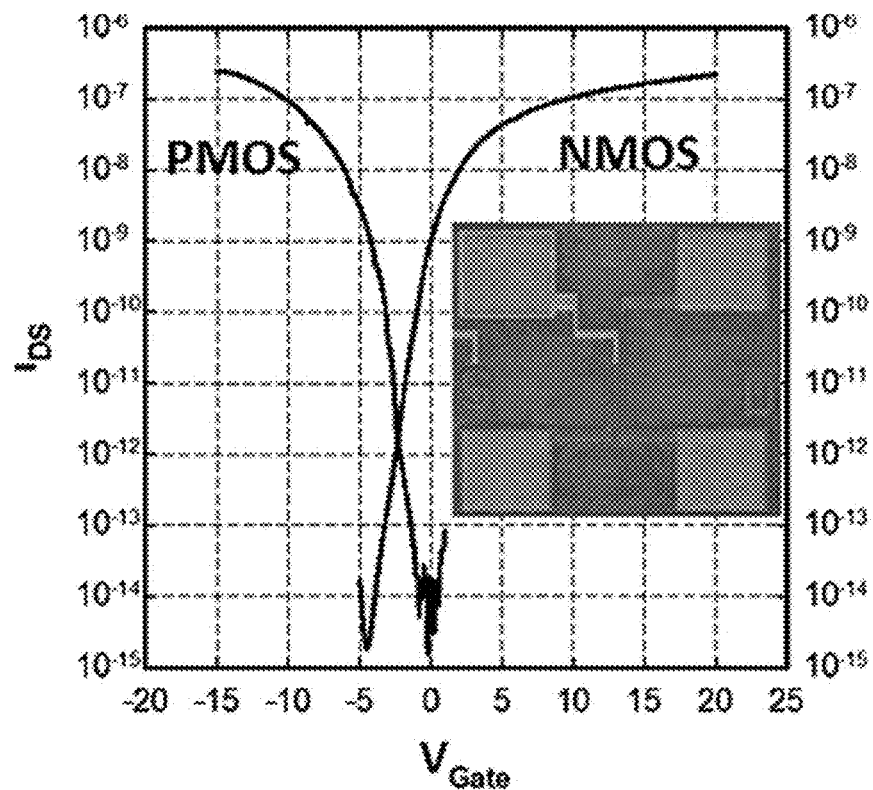
FIG. 4G provides IDs data for PMOS and NMOS FETs in accordance with various embodiments of the invention.

The pure semiconductor characteristics of nonlinear current-bias curves were demonstrated in metal|carbon nanotube network|metal double diodes. Based on these Shottky diodes, both PMOS and NMOS field effect transistors fabricated exhibit $f_A$ off-current and >108 ION/IOFF ratio for both p- and n-charge carriers (see, e.g., FIGS. 4F & 4G). The electronic purity of the SWCNTs was confirmed by third party testers. The purity of the CNTs allows for embodiments to provide improved performance in CNT circuits.

Embodiments Implementing Individual Single-Walled Carbon Nanotube Alignment

Figure 5A:
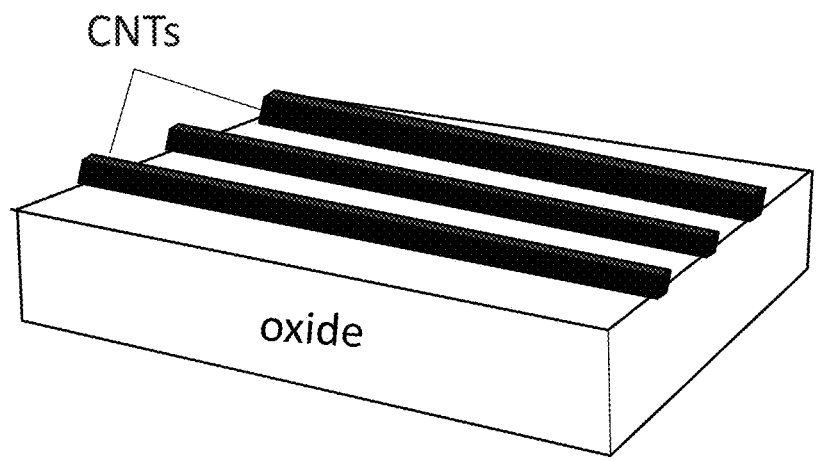
FIG. 5A illustrates a nanochannel array in accordance with various embodiments of the invention.
Figure 5B:
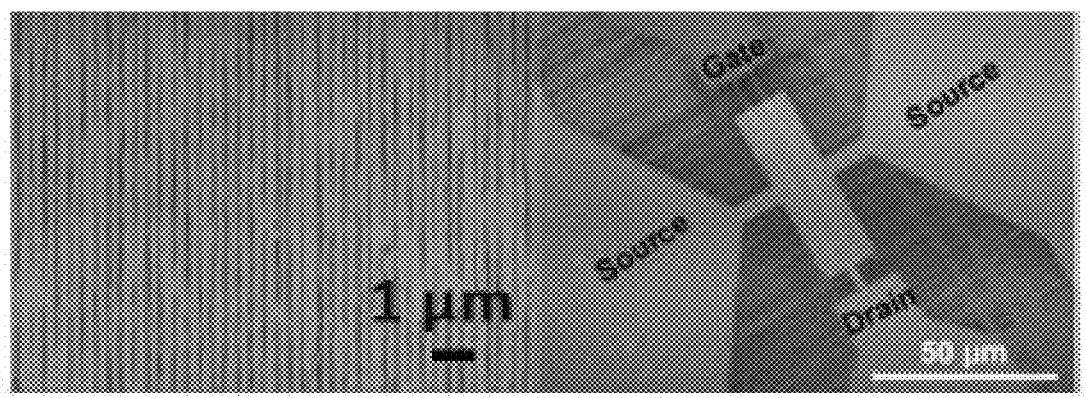
FIG. 5B provides an image of a nanochannel array and a CNT RF device in accordance with various embodiments of the invention.

Currently, the best CFET device performance reported have a $f_T$ and $f_{MAX}$ of 70 GHz, respectively, and an OIP3 of 33 dB measured at 1 GHz with aligned polymer wrapping purified single-walled carbon nanotubes. (See, e.g., Park, H. et al., Nature Nanotechnology, vol. 7, pp. 787-791, 2012, the disclosure of which is incorporated herein by reference.) To improve these results embodiments implement alignments of single separated carbon nanotubes disposed in nano grooves at a narrow range of density (e.g., 10-30 CNTs/μm) at an aligned carbon nanotube length of at least 1 μm, as shown in FIGS. 5A and 5B. The use of individual single carbon nanotubes to mitigate electronic property variation and to have high carbon nanotube density to generate sufficient current density. Thus embodiments having been found to take advantage of depletion forces to improve performance of RF devices. (See, e.g., Wu, J. et al., Advanced Materials, vol. 26, pp. 6151-6156, 2014, the disclosure of which is incorporated herein by reference.)

Specifically, aligned carbon nanotubes will reduce crossing points with contact resistances and winding carrier transports that dominate in conventional carbon nanotube networks. Additionally, uncontrolled bundles in aligned patterns bring variations in electric properties that can be avoided. Nanoscale trench confinement combined with the depletion force of surfactants wrapped around carbon nanotubes, in accordance with embodiments, allows for the formation of individually aligned carbon nanotube arrays to directly bridge channel region without crossings or forming a percolated network since the carrier mobility in the latter is determined by the "point" contacts formed by the crossings and is thus much lower than in the tube itself. The complication in such embodiments is in scaling up the alignment of individual electronically pure single chirality single-walled carbon nanotube to operate at a wafer scale.

Several methods have been reported to align separated carbon nanotubes such as low frequency dielectrophoresis (Krupke, R. et al., Applied Physics A vol. 76, pp. 397-400, 2003; Cao, Q. et al., Nature Communications, vol. 5, pp. 5071, 2014; and Hennrich, F. et al., ACS Nano, vol. 10, pp. acsnano.5b05572, 2016), molecular attraction self-assembly, crystal template (Kawai, H. et al., Applied Physics Letters, vol. 105, pp. 093102, 2014), evaporation-driven self-alignment (Shastry, T. A. et. al., Small, vol. 9, pp. 45-51, 2013; and Joo, Y. H. et. al., Langmuir, vol. 30, pp. 3460-3466), Langmuir-Blodgett (Li, X. et al., Journal of the American Chemical Society, vol. 129, pp. 4890-4891, 2007), Langmuir-Shaeffer, solution shearing (Park, S. et al., Advanced Materials, vol. 27, pp. 2656-2662, 2015), and depletion forces (Li, S. et al., Small, vol. 3, pp. 616-621, 2007 and Wu, J. et al., Small, vol. 9, pp. 4142-4148, 2013). However, these techniques are difficult to scale up to wafer side.

Figure 6:
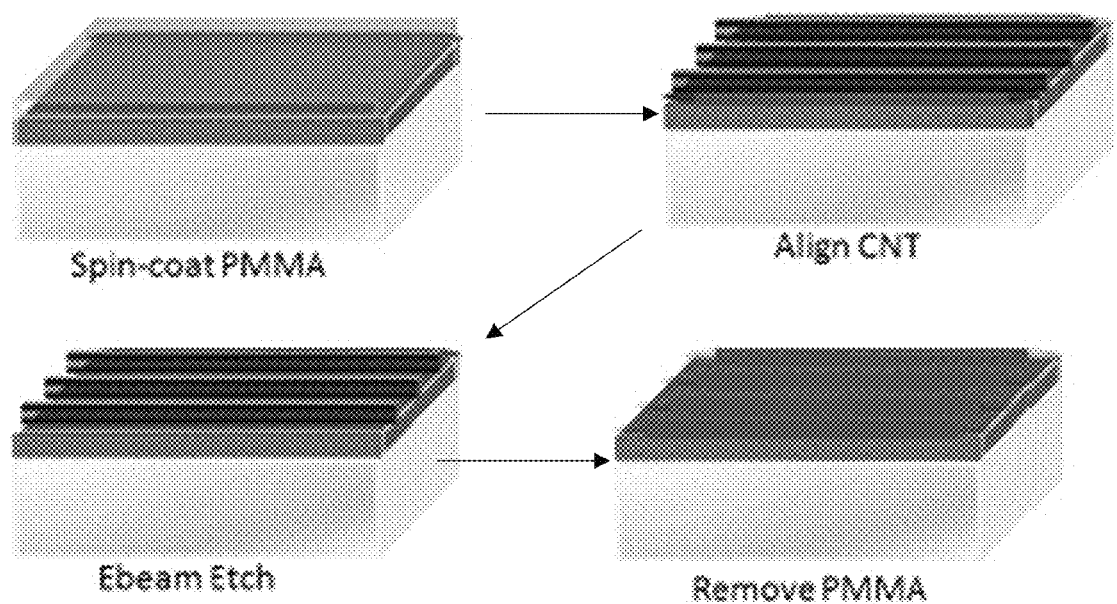
FIG. 6 illustrates a process for forming nanochannel arrays in accordance with various embodiments of the invention.

Embodiments utilize interactions of surfactants with various surfaces to align electronically pure individual single-chirality semiconducting single-walled carbon nanotube within nanoscale trenches formed within a substrate (e.g., by e-beam patterning). Specifically, as shown in FIG. 6, in various embodiments on the substrate, e-beam resistant PMMA will be coated. The channel patterns in such embodiments are then defined with e-beam lithography. The dimensions of the channels may be tailored to a specific application and desired CNT density. For instance, in a 1 μm (channel length)×50 μm (channel width) outline, 1 μm×60 nm strips were etched and separated by 40 nm PMMA sidewalls. If only one carbon nanotube is aligned inside each strip, the density will be 10 carbon nanotubes per μm. To increase carbon nanotube density, the strip width can be reduced from 60 nm and PMMA sidewall from 40 nm.

Figure 7A:
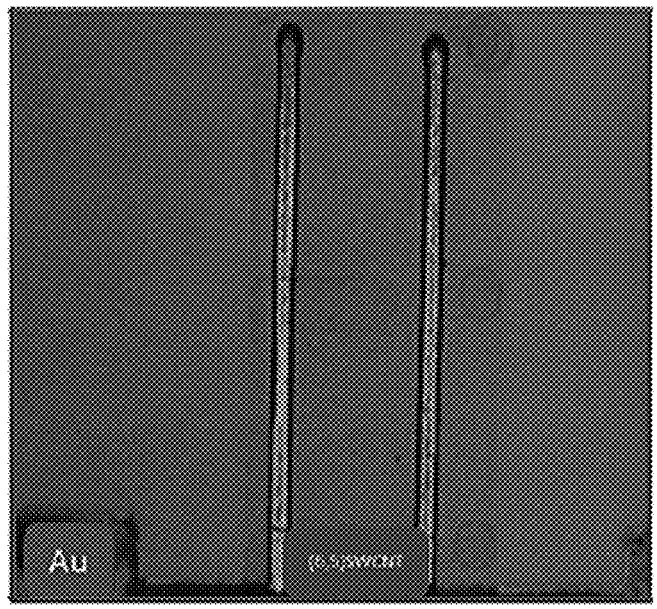
FIGS. 7A and 7B provide AFM images of deposited nanotubes in accordance with various embodiments of the invention.
Figure 7B:
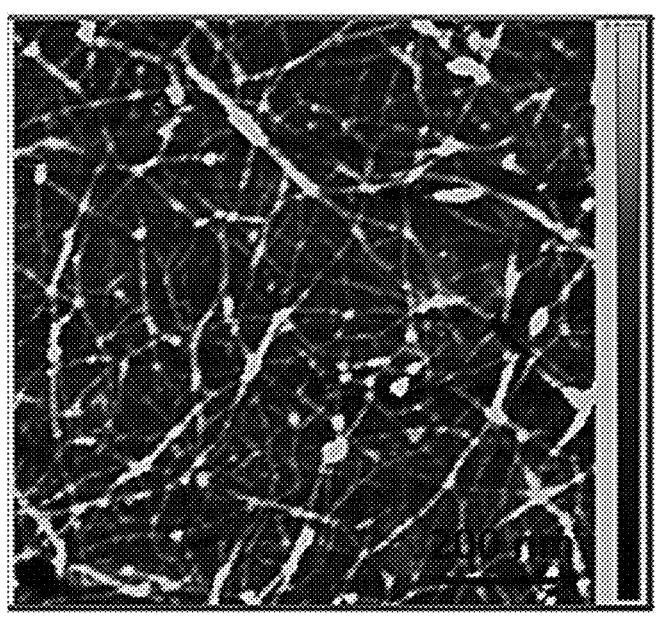

To assist the alignment of carbon nanotube, the patterned strips may be functionalized with a suitable material (e.g., poly(L-lysine) aqueous solution). Because of the hydrophobic nature of PMMA, the poly(L-lysine) aqueous solution will be confined in these patterned strips. After removal of poly(L-lysine) aqueous solution and extensively washing with de-ionized (DI) water, electronically pure single-chirality single-walled carbon nanotube aqueous solution will be deposited on these poly(L-lysine) functionalized strips. Many embodiments implement aerosol jet printing technologies to deposit consistent and uniform carbon nanotube networks and cleaning methods to completely desorb the surfactants that are used to disperse the carbon nanotubes in aqueous solution. The order and uniformity of CNT networks deposited according to such embodiments is evidenced in the AFM height image (see, e.g., FIGS. 7A & 7B).

Sodium cholate (SC) dispersed carbon nanotubes rapidly adsorb on poly(L-lysine) surfaces and sodium dodecyl sulfonate (SDS) dispersed carbon nanotubes slowly interact with poly(L-lysine), an appropriate ratio of SC/SDS may be optimized according to embodiments to align carbon nanotubes inside poly(L-lysine) functionalized strips. To avoid bundles, the carbon nanotube concentration may also be optimized to have one carbon nanotube inside each strip. After removal of carbon nanotube solution, the substrate is baked on a hotplate at 120° C. for 10 minutes. This step is required to maintain the aligned carbon nanotubes in their original positions. The substrate is then extensively washed with DI water to remove any surfactant residuals. The last step is to remove the e-beam resistant PMMA by immersing the substrate inside a suitable bath (e.g., acetone).

The obtained patterns with aligned carbon nanotubes according to embodiments will be characterized with scanning electron microscopy (SEM) and atomic force microscopy (AFM). FIGS. 8A to 8D exhibit SEM and AFM images of aligned carbon nanotubes in accordance with such embodiments.

Figure 2A:
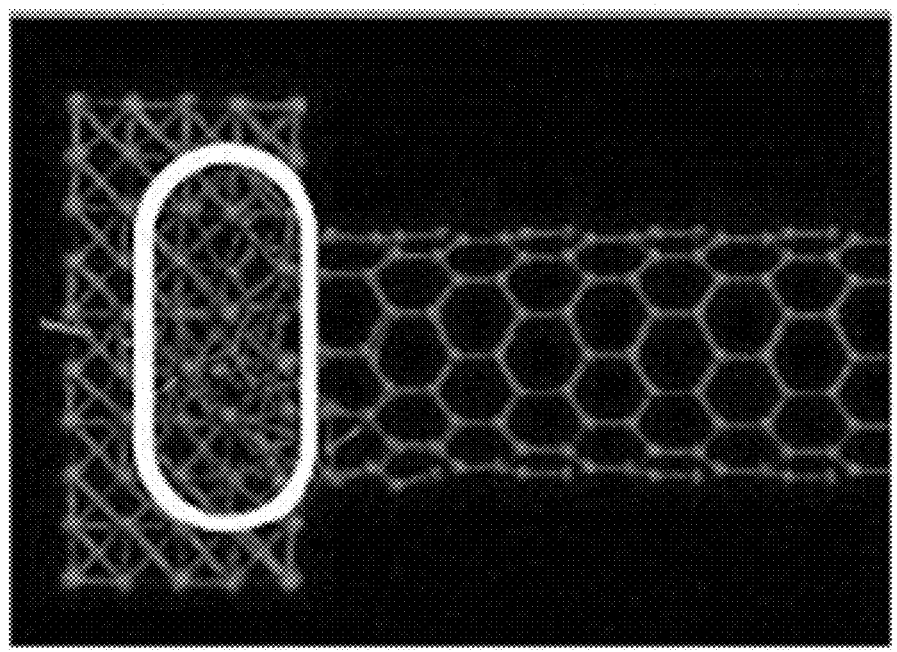
FIG. 2A illustrates the interfacial region of a carbon nanotube in accordance with various embodiments of the invention.
Figure 2B:
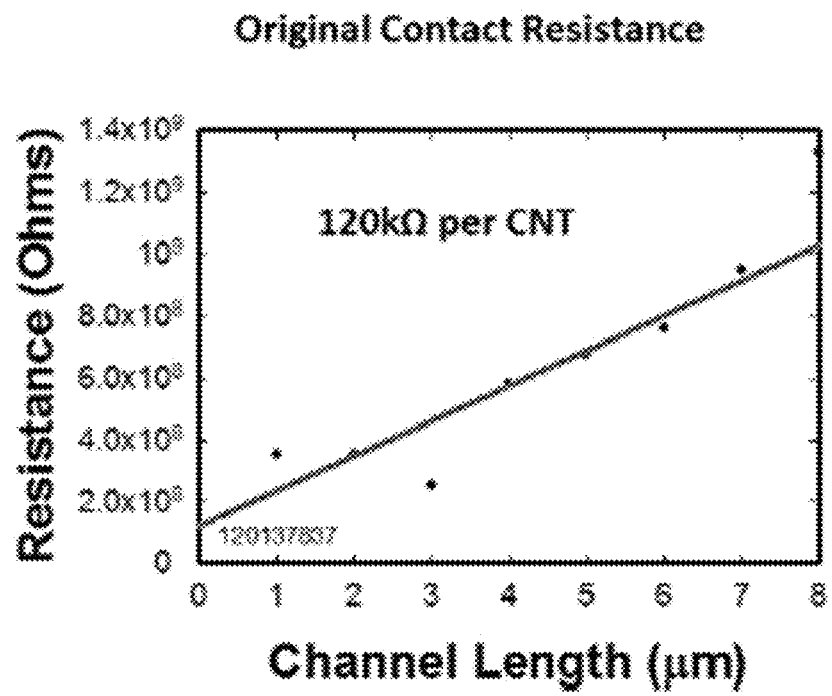
FIG. 2B provides a data showing resistance versus contact length for an unmodified carbon nanotube in accordance with various embodiments of the invention.
Figure 2C:
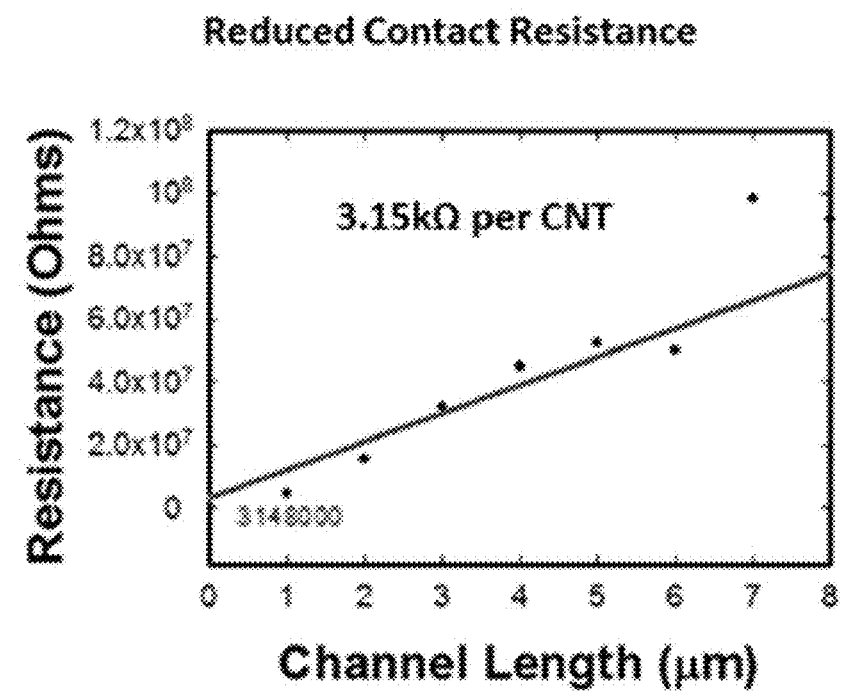
FIG. 2C provides a data showing resistance versus contact length for a carbon nanotube having an interfacial layer associated therewith in accordance with various embodiments of the invention.

In summary, CNT enabled RF transistors (e.g., field effect transistors) in many embodiments incorporate the following features:
   High purity (>99%) narrow-distributed large diameter (~1.6 nm±0.1 nm) semiconducting carbon nanotubes (FIG. 3B).
   Reduced carrier injection barriers and lowered contact resistance via interfacial dipole moment alignment between the device substrate and the CNTs (FIG. 2A).
   A plurality of channels having within disposed a plurality of aligned CNTs (FIG. 4A).

Embodiments Implementing Fabrication Processes

Although the above discussion has focused on device architectures, many embodiments are also directed to methods and processes in CNT alignment and deposition, material contact and doping to create high quality CNT arrays beyond current state-of-the-art for device engineering and establish a robust process capable of producing environmentally stable high performance RF transistors based on CNTs. All these process developments will be scalable to wafer size to enable fabrication of monolithic integrated circuits. More specifically, embodiments allow for the fabrication of clean aligned CNT films with super pure semiconducting single walled carbon nanotubes with single chirality and narrow distributed diameters on which the contact resistance is lower than 25 kΩ per carbon nanotube contact with interfacial conjugated polyelectrolytes. Embodiments of methods and processes are configured to fabricate wafer-scale hysteresis-free CNT RF devices (e.g., field effect transistors) with at least the following metrics:
   DC: ION/W>500 mA/mm, ION/IOFF>1000, and in some embodiments ION/W>700 mA/mm, gm/W>700 mS/mm;
   RF: $f_T$ and $f_{max}$>50 GHz, and in some embodiments $f_T$>130 GHz, $f_{max}$>180 GHz; and
   a third-order intercept (IP3) at least 10 dB higher than its 1 dB compression power (P1 dB), and in some embodiments at least 15 dB higher than its 1 dB compression power (P1 dB).

Many embodiments of methods and processes are configured to be compatible with existing Si infrastructure and integration with CMOS fabrication lines.

As previously discussed, devices implementing individually aligned single-chirality semiconducting single-walled carbon nanotube arrays according to embodiments intrinsically mitigate the electric variation caused by nanotube diameter distribution and nanotube bundles. The aligned carbon nanotubes array directly bridge drain/source electrodes to eliminate the crossing between nanotubes and the forming of percolated network. The aligned patterns do not require etching carbon nanotubes for patterning that could produce defects, doping and undesired materials leading to hysteresis and carrier scattering. Moreover, the cleaning methods according to embodiments effectively remove surfactants for carbon nanotube dispersion to limit the hysteresis. Finally, the use of interfacial dipole moment alignment of conjugated electrolyte according to embodiments can dramatically reduce contact resistance from >120 kΩ per carbon nanotube to 3 kΩ per carbon nanotube.

Embodiments discussed here implement these processes and architectures to construct exemplary RF devices. Radio frequency carbon nanotube field effect transistors have been extensively investigated. Early research reported that single carbon nanotube FET can achieve ~20 μS transconductance at a short channel (300 nm). (See, e.g., Li, S. et al., *Nano Letters*, vol. 4, pp. 753-756, 2004; Yu, Z. et al., *Applied Physics Letters*, vol. 88, pp. 233115, 2006; and Wang, D. et al., *IEEE Transactions on Nanotechnology*, vol. 6, pp. 400-403, 2007, the disclosures of each of which are incorporated herein by reference.) RF CNT FET constructed on aligned carbon nanotubes via chemical vapor deposition growth exhibited 25 GHz and 9 GHz for the extrinsic cut-off current gain frequency ($f_T$) and extrinsic maximum power gain frequency ($f_{MAX}$), respectfully. With the alignment of separated semiconducting carbon nanotubes, $f_T$ of 7 GHz and $f_{MAX}$ of 15 GHz were reported for their CNT FETs. Recent progress on RF CNT FETs was reported with $f_T$ of 23 GHz and $f_{MAX}$ of 20 GHz with separated semiconducting carbon nanotube networks and $f_T$ and $f_{max}$ of 70 GHz with aligned polymer separated CNTs. Although these properties are promising, RF CNT FETs devices formed with separated semiconducting carbon nanotubes seem to have strong hysteresis and significant contact resistance. Among these RF CNT FETs, some devices were top-gated with dielectrics such as $Al_2O_3$, $HfO_2$, $Y_2O_3$, and $BCB/HfO_2$. Some devices were back-gated with dielectric layer of $Al_2O_3$ and $HfO_2$. Especially with these embedded back gates, the intrinsic $f_T$ as large as 153 GHz and $f_{MAX}$ as 30 GHz were reported, even their extrinsic $f_T$ and $f_{MAX}$ were about 7 GHz and 15 GHz.

To implement such devices according to embodiments, methods and processes must fabricate sub-micrometer channel lengths and follow precise gate alignments. Device structures for carbon nanotube array FETs in accordance with embodiments are configured with suitable channel length and an optimized dielectric layer. Fabrication processes may be used to achieve hysteresis-free devices. Using embodiments of processes and methods may be used to for top or back-gated structures, as discussed in relation to FIG. 1B, above.

Figure 10:
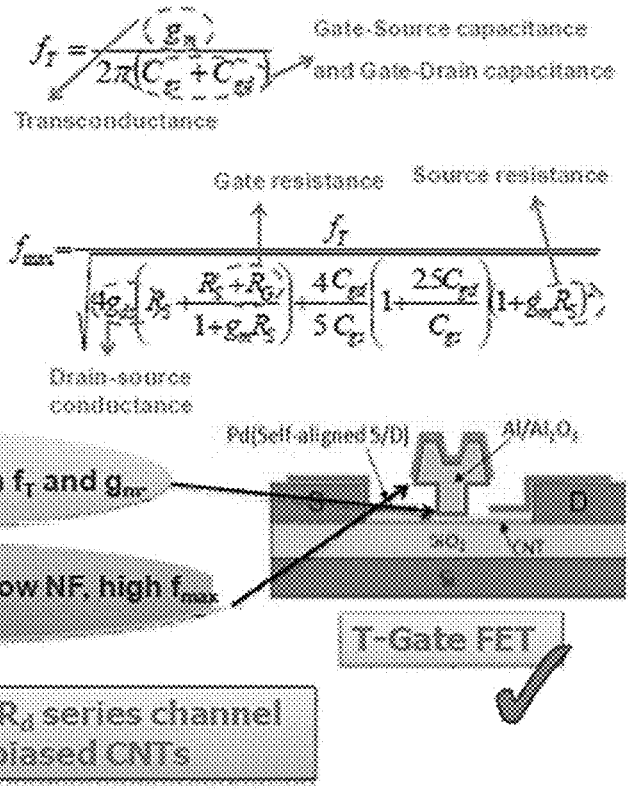
FIG. 10 illustrates properties of T-gate CNT RF FET devices in accordance with various embodiments of the invention.

In many embodiments a top-gated single carbon nanotube FET is implemented. In some such embodiments, a T-gate device may be fabricated, as shown in FIG. 9. As shown, to fabricate T-gate CNT FETs electronically pure single chirality semiconducting carbon nanotubes are aligned on a suitable substrate (e.g., silicon, quartz, etc.) as previously described. Then drain/source pre-pads are disposed on the aligned carbon nanotubes to form a channel of suitable length and width (e.g., length of 1 μm and width of 50 μm (FIG. 9, Step 1)). Inside the channels, dielectric materials are deposited into patterned T-shape structures using ebeam etching on MMA/PMMA resistance following dielectrics deposition (FIG. 9, Step 2). The final step is to spin-coat an interfacial CPE layer and to pattern drain/source electrodes along the T-gate dielectric layer and 10 nm gate electrodes by lift-off (FIG. 9, Step 3). The advantages of T-gate RF devices are summarized in FIG. 10. In short, with T-gate RF devices the transconductance and $f_T$ are expected to increase by more than a factor of two. The combination also give controlled conduction in the CNT FET allowing the intrinsic linearity of the materials to be realized.

In other embodiments, a bottom-gated single carbon nanotube FET may be fabricated (either atop the substrate or embedded within the substrate). As shown in FIG. 11, in such embodiments a suitable substrate (e.g., silicon wafer (SiO2 thickness >1 μm)), is etched using a photolithograph pattern (FIG. 11, Step 1). The bottom gate is then patterned by lift-off after metal (Ti/Pd) deposition (FIG. 11, Step 2). Then the dielectric layer is deposited following the developed process (FIG. 11, Step 3). On the deposited dielectric layer, electronically pure single-chirality carbon nanotubes are aligned as described above (FIG. 11, Step 4). The final step is to spin-coat an interfacial CPE layer and assembly drain/source electrodes to form a short channel (FIG. 11, Step 5).

Although some specific methods and processes are described above, it will be understood that these methods and processes (e.g., materials, methods, temperatures, etc.) may be optimized according to embodiments by comparing the maximum transconductance of various device structures and dielectric materials selection and deposition

EXEMPLARY EMBODIMENTS

The following described specific exemplary devices and results from tests and studies conducted on such devices. The embodiments are only disclosed to provide examples and illustrations, and are not meant to be limiting to the scope of the possible embodiments.

Example 1: Characterization Studies of Embodiments

Figure 12A:
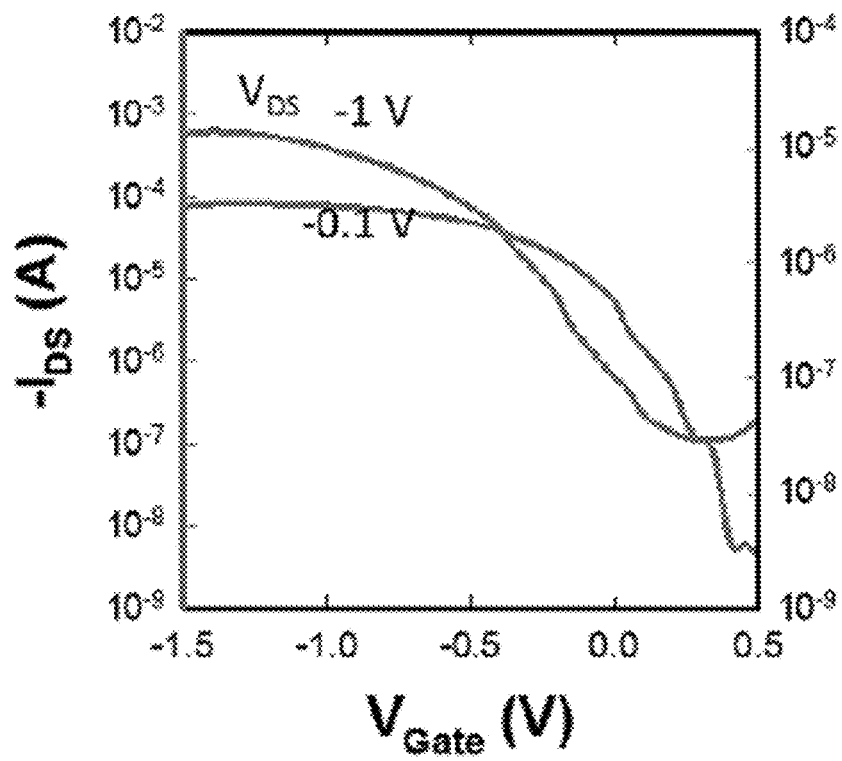
FIG. 12A provides transfer data for a CNT RF FET device in accordance with various embodiments of the invention.
Figure 12B:
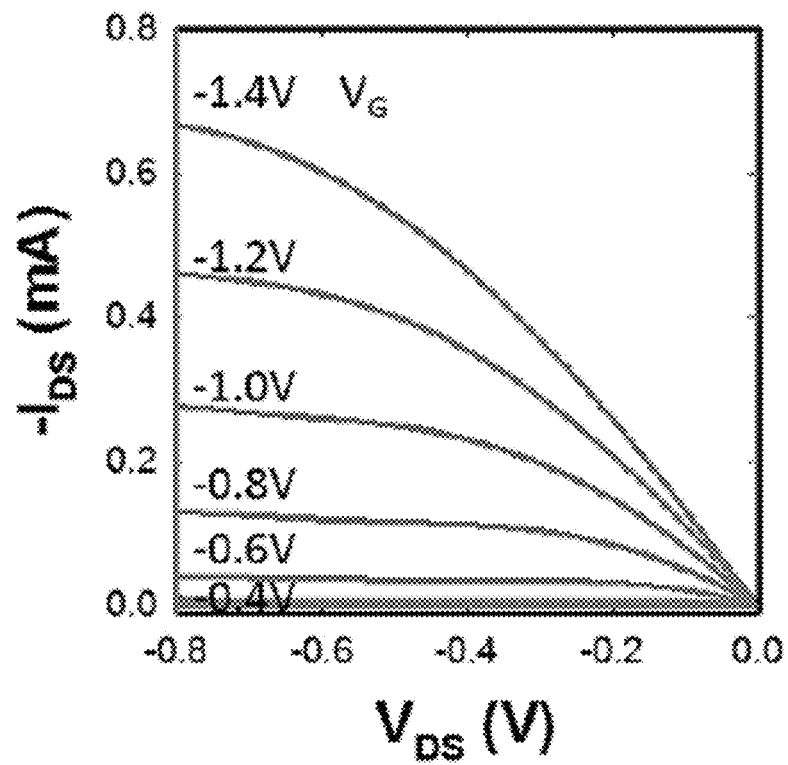
FIG. 12B provides output data for a CNT RF FET device in accordance with various embodiments of the invention.

Performance of different device architectures with different dielectric materials and deposition methods may be characterized to allow for optimization. Characterization may be conducted using a Keithley 4200 SCS. Measurements will be conducted on their transfer (IDS-VGS) and output (IDS-VDS) characteristics (see, e.g., FIGS. 12A & 12B). Results show these devices to be air stable, without any degradation after two years.

Based on the measured data, it is possible to estimate transconductances, mobilities, subthreshold swing, ION/IOFF ratio, and hysteresis. These results may be compared to those obtained from single carbon nanotube FET to check their consistency. And those DC characterization results processed to obtain the optimized bias point for late RF characterization, for example, at the point with the maximum transconductance on the 3D map of transconductance vs VDS and VGS (where the 3D map is extracted from IDS-VDS curves at different VGS).

Figure 13A:
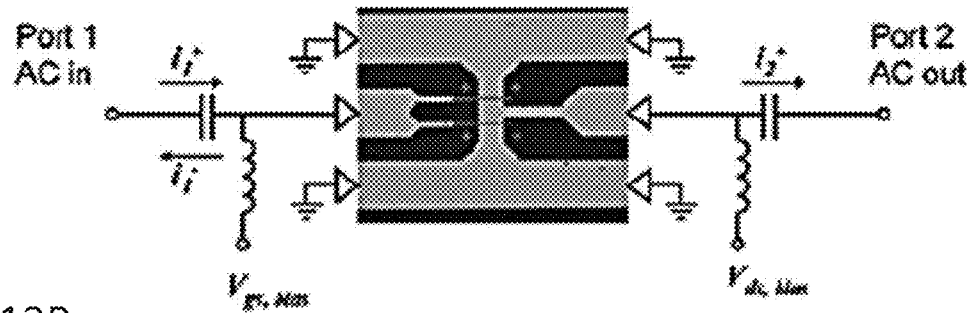
FIG. 13A illustrates an RF measurement setup in accordance with various embodiments of the invention.

RF Characterization: To characterize the RF performance of carbon nanotube array RF FETs, standard Sparameter measurement may be conducted utilizing Ground-Signal-Ground (GSG) probes and N5242A PNA-X vector network analyzer (VNA). The measurement setup is shown in FIG. 13A, where the sources are grounded, and the DC biases supplied to the gate and drain terminal through the bias-T. For the RF measurement, the gate and drain may be biased at what will give the maximum gm, as that extracted from 3D transconductance map in DC characterization. Before RF measurement, the VNA probe measurement system may be calibrated by the short-open-load-through (SOLT) method.

Since two types of CNTFET performance are to be extracts, namely, extrinsic and intrinsic, two calibration standards may be used. For extrinsic performance, the calibration substrate from GGB INDUSTRIES INC may be used as the calibration standard; for intrinsic performance, in order to get rid of parasitic capacitance and inductance with gate and drain such as the pads specially for the probes, customized short (CNT area filled with metal) and open (blank that no CNT) structures may be utilized.

Figure 13B:
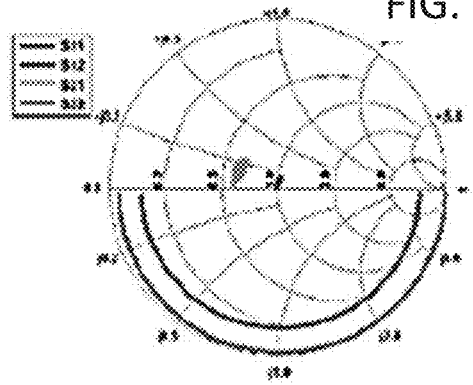
FIG. 13B provides a Typical Smith Charter graph for CNT RF FET devices in accordance with various embodiments of the invention.
Figure 13C:
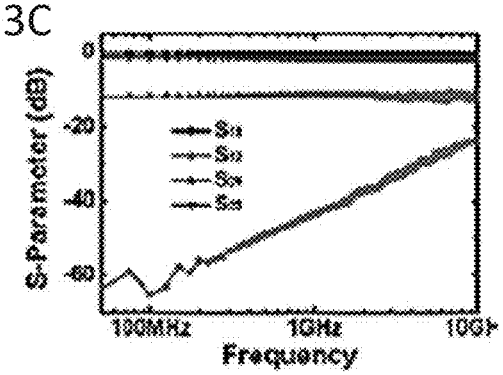
FIG. 13C provides as measured S-parameters for CNT RF FET devices in accordance with various embodiments of the invention.

After the calibration, S parameters of carbon nanotube array FET will be measured from 50 MHz to 20 GHz on different biases (FIG. 13C). FIG. 13B shows the typical Smith Chart. Based on the S parameters, the carbon nanotube array FET high-frequency performance, for example, the current gain, maximum available gain, small signal input impedance and output impedance can be easily derived.

$$h_{21} = \frac{-2S_{21}}{(1-S_{11})(1+S_{22}) + S_{12}S_{21}} \quad \text{(EQ. 1)}$$

$$G_{max} = \left|\frac{S_{21}}{S_{12}}\right| \text{ for } K < 1 \quad \text{(EQ. 2)}$$

Or $$G_{max} = \left|\frac{S_{21}}{S_{12}}\left(K - \sqrt{K^2-1}\right)\right| \text{ for } K > 1 \quad \text{(EQ. 3)}$$

where K is the stability factor that can be calculated using the following equation:

$$K = \frac{1 + |S_{11}S_{22} - S_{12}S_{21}|^2 - |S_{11}|^2 - |S_{22}|^2}{2|S_{12}S_{21}|} \quad (EQ.\ 4)$$

Figure 13D:
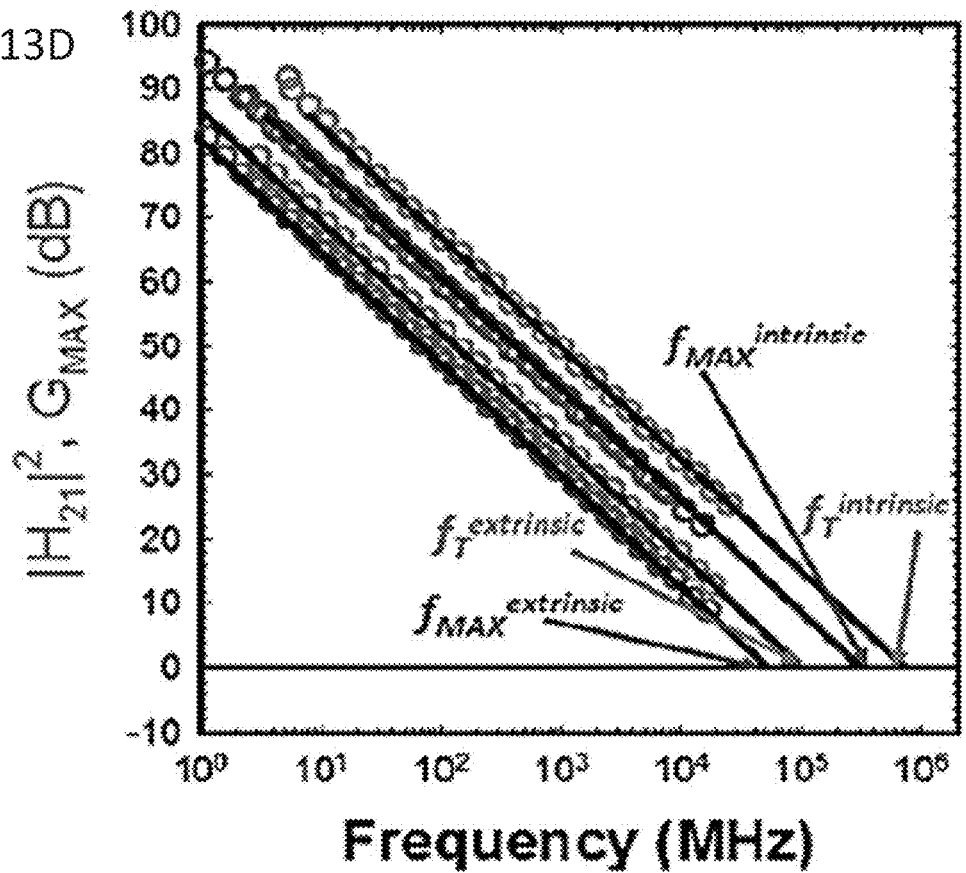
FIG. 13D provides expected intrinsic and extrinsic $f_T$ and $f_{MAX}$ for CNT RF FET devices in accordance with various embodiments of the invention.

The derived $h_{21}$ and $G_{MAX}$ will be as a function of frequency in FIG. 13D. From the plot, one can define extrinsic $f_T$ and $f_{MAX}$ at the current gain $h_{21}$ and $G_{MAX}$ drop to 0 dB. These frequencies are the highest frequencies at which electrical signals can be propagated in the transistor and electrical power gain can be achieved, respectively. Extrinsic $f_T$ is the frequency at which the ratio of the output current to the input current equals unity assuming the output of the transistor is shorted to ground. Extrinsic $f_{MAX}$ is the frequency at which the ratio of output power to the input power equals unity assuming the output is terminated to the characteristic impedance of a system. Extrinsic $f_{MAX}$ is of more importance than extrinsic $f_T$ since output terminals are usually matched to characteristic impedance in practical applications. To reveal the electrical transport properties of the transistor itself, the intrinsic transistor performance (both $f_T$ and $f_{MAX}$) can be obtained from the derived $h_{21}$ and $G_{MAX}$ as a function of frequency by performing SOLT de-embedding techniques that rule out the effect from the parasitic capacitance.

The intrinsic and extrinsic $f_T$ and $f_{MAX}$ are expected to be two times greater than current RF performance (intrinsic $f_T$ and $f_{MAX}$ of 153 GHz and 30 GHz, extrinsic $f_T$ and $f_{MAX}$ of 23 GHz and 20 GHz) due to the alignment of electronically pure single chirality carbon nanotube and the improved carrier injection (extremely low contact resistance) by employing interfacial conjugated polyelectrolyte which lead to ultrahigh transconductance greater than 20 µS per carbon nanotube.

Example 2: Wafer Scale DNT RF Device Fabrication

Figure 14A:
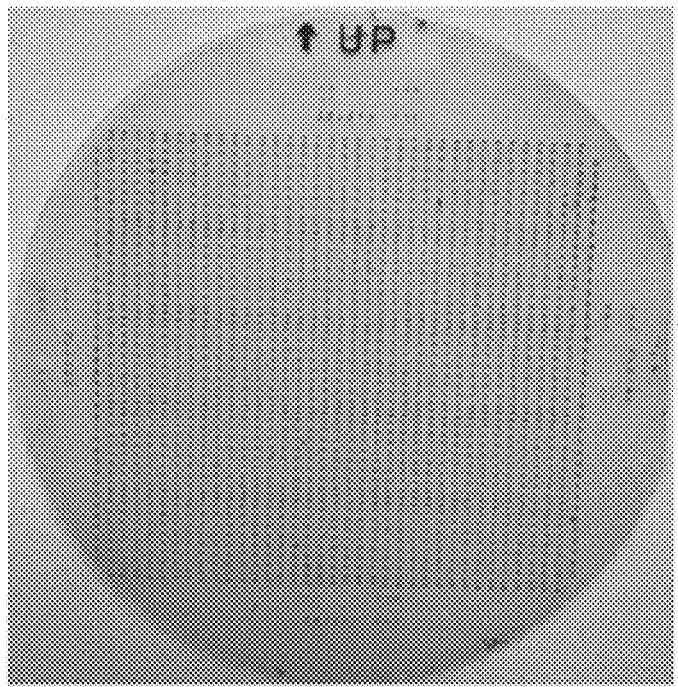
FIG. 14A provides an image of a waver scale CNT RF device in accordance with various embodiments of the invention.
Figure 14B:
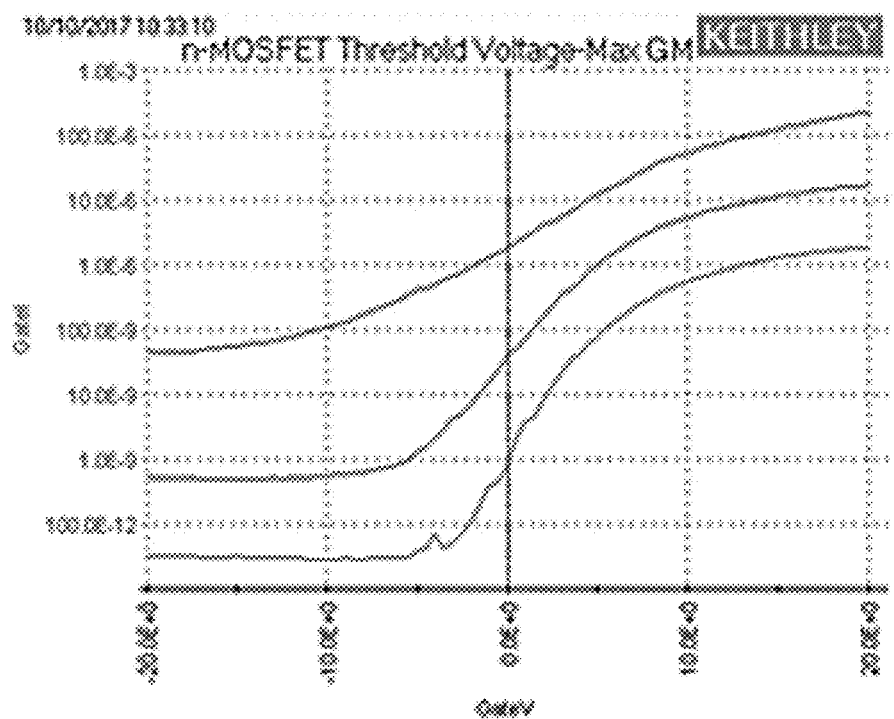
FIG. 14B provides transfer characteristics of a wafer scale CNT RF device in accordance with various embodiments of the invention.

Various embodiments are directed to fabrication processes to attain robust and air stable CNT RF devices which can be fabricated in wafer scale. Although aligned CNT RF devices with metrics of $f_T$ and $f_{MAX}$ greater than 70 GHz and a third-order intercept (IP3) 22 dBm about 7 dBm higher than its 1 dB compression power (P1 dB), the ON/OFF ratios of their devices are less than 100 and the CNT RF devices are not air stable and seriously degraded after one or two months. Moreover, the prior art aligned CNT films are limited with their alignment facilities, normally less than 1 cm×1 cm area size. Current embodiments seek to achieve wafer scale air stable CNT devices with ON/OFF ratios greater than 1000, and consistent performance after three years (FIGS. 14A & 14B).

A key challenge for implementing such embodiments include the deposition of the T-gate stack including oxide deposition and metallization and etch processing in less than a 100 nm channel at large scale. Using large-scale foundry facilities wafer-scale, air-stable, uniform electronically pure single-walled carbon nanotubes (CNTs) transistors have been produced. Based on these electronically pure CNT thin films (FIG. 15A), T-gated Al/Al$_2$O$_3$ (FIG. 15B) CNT RF devices have been produced. The 1 dB compression for the T-gate RF devices with parameters (50 µm total width, 200 nm length, gate bias of −0.5 volts, drain bias of 1.0 volts, on an 8.4 mA of total drain current) were investigated to show 11.9 dB output referred and 6 dB of power gain (FIG. 15C). Typical $f_{MAX}$ of 524 MHz was obtained for RF device of 50 µm total width, with a length of 200 nm, exhibiting p-type behavior, biased at a gate source voltage of −0.5 volts and a drain source voltage of −1.0 volts, drawing 8.4 mA of drain current (FIG. 15D).

Figure 16A:
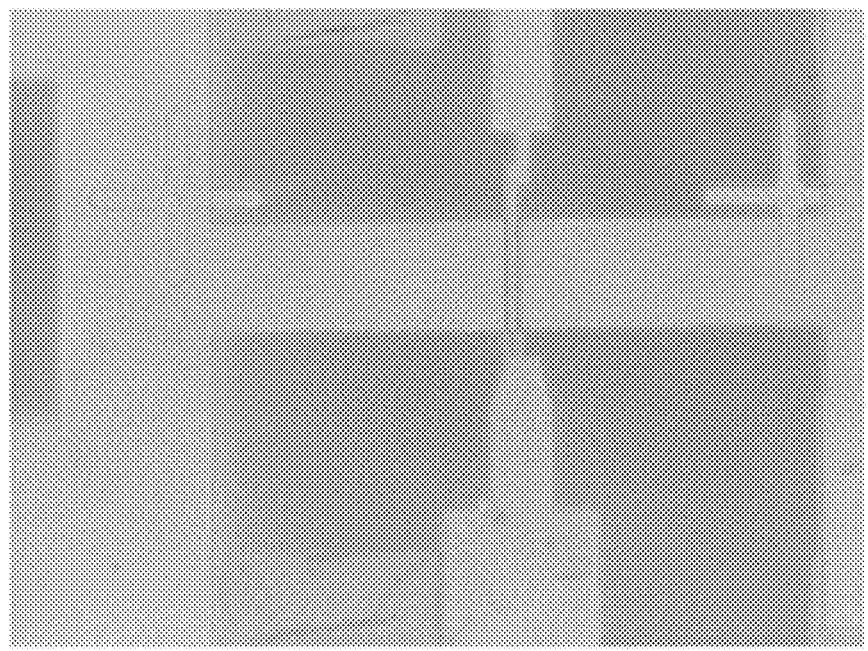
FIG. 16A provides an image of an exemplary CNT TFT RF device in accordance with various embodiments of the invention.
Figure 16B:
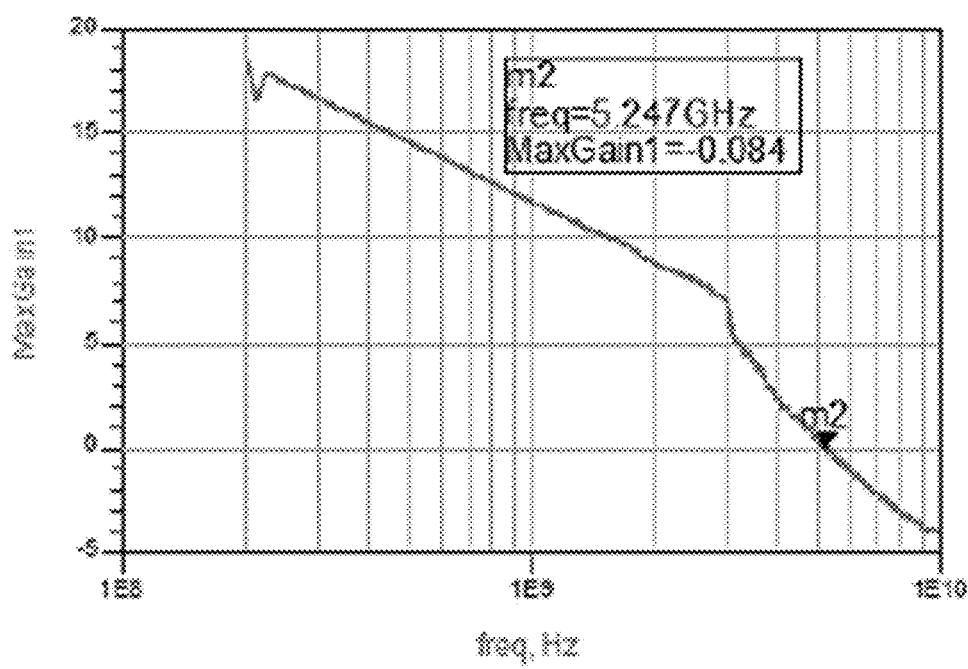
FIG. 16B provides typical $f_{MAX}$ data for the device of claim 16A in accordance with various embodiments of the invention.

Using such techniques, in accordance with embodiments, T-gate carbon nanotube TFT RF devices were fabricated and characterized with a preliminary result of 5 GHz $f_{MAX}$ (see, e.g., FIGS. 16A and 16B).

DOCTRINE OF EQUIVALENTS

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed is:

1. A carbon nanotube based radio-frequency device comprising:
   a substrate having disposed on a face thereof a plurality of parallel nanochannels configured as an array;
   a source and a drain electrode disposed on the substrate and defining a channel within which the plurality of nanochannels are disposed;
   at least one single-walled carbon nanotubes of a narrowly-distributed diameter disposed within each of the plurality of parallel nanochannels and directly bridging the channel;
   wherein each of the single-walled carbon nanotubes is electronically pure, has a single chirality structure, and is individually configured to align within one of the plurality of nanochannels;
   a conjugated electrolyte layer disposed between the plurality of carbon nanotubes and the source and drain electrodes; and
   at least one gate electrode disposed within the channel.

2. The radio-frequency device of claim 1, wherein the carbon nanotubes have at least a 99% purity, a length of >1 µm, and a diameter of >0.7 nm with a distribution of diameters of ±0.1 nm.

3. The radio-frequency device of claim 1, wherein the carbon nanotubes have a diameter of around 1.6 nm±0.1 nm.

4. The radio-frequency device of claim 1, wherein the carbon nanotubes are arranged within the nanochannels such that there are no point crossings between the individual carbon nanotubes.

5. The radio-frequency device of claim 1, wherein the nanochannels have a length of at least 1 µm and a width of 60 nm.

6. The radio-frequency device of claim 1, wherein the nanochannels are functionalized with poly(L-lysine).

7. The radio-frequency device of claim 1, wherein the carbon nanotube density is around 10 to 30 carbon nanotubes per µm.

8. The radio-frequency device of claim 1, wherein the gate electrode is selected from the group consisting of a T-gate, a back gate, and an embedded back gate.

9. The radio-frequency device of claim 1, wherein the nanochannels are formed from a PMMA material.

10. The radio-frequency device of claim 1, wherein the device has an ION/W>500 mA/mm, ION/IOFF>1000, $f_T$ and $f_{max}$>50 GHz, and a third-order intercept (IP3) at least 10 dB higher than its 1 dB compression power (P1 dB).

11. A method of forming a carbon nanotube based top-gated radio-frequency device comprising:
provoking a substrate and forming a plurality of nanochannels;
disposing at least one single-walled carbon nanotubes of a narrowly-distributed diameter disposed within each of the plurality of nanochannels forming a carbon nanotube array;
wherein each of the single-walled carbon nanotubes is electronically pure, has a single chirality structure, and is individually configured to align within one of the plurality of nanochannels;
washing the carbon nanotube array to remove unwanted carbon nanotubes;
depositing a drain pre-pad and a source pre-pad atop the carbon nanotube arrays to form a channel between said drain and said source pre-pads and such that the carbon nanotube array directly bridges said channel;
forming a dielectric gate electrode structure within the channel atop the carbon nanotube array;
depositing an interfacial conjugated electrolyte layer atop the carbon nanotube array; and
depositing a set of conductive source, drain and gate electrode layers atop the drain pre-pad, source pre-pad, gate electrode structure and interfacial layer to electrically interconnect the electrodes and the carbon nanotube array.

12. The method of claim 11, further comprising purifying the pure single chirality single-walled carbon nanotubes by iterative gradient ultracentrifugation such that the carbon nanotubes have at least a 99% purity, a length of >1 μm, and a diameter of >0.7 nm with a distribution of diameters of ±0.1 nm.

13. The method of claim 11, wherein forming the carbon nanotube array further comprises:
depositing an ebeam resistant layer atop the substrate;
forming a plurality of nanochannels in the ebeam resistant layer by e-beam etching;
functionalizing the channels with a poly(L-lysine) material;
washing the functionalized channels;
depositing a solution of the carbon nanotubes on the functionalized channels, wherein the solution is a mixture of carbon nanotubes dispersed by one or more surfactants;
baking the substrate;
washing the baked substrate to remove excess carbon nanotubes; and
removing the ebeam resistant material from the substrate.

14. The method of claim 13, wherein the surfactants are sodium cholate and sodium dodecyl sulfonate.

15. The method of claim 11, wherein the carbon nanotubes are arranged within the nanochannels such that there are no point crossings between the individual carbon nanotubes.

16. A method of forming a carbon nanotube based back-gated radio-frequency device comprising:
providing a substrate and forming a drain, a source and a gate pre-pad thereon to define a channel;
depositing a layer of dielectric atop the pre-pads;
forming a plurality of nanochannels atop the dielectric layer and disposing at least one single-walled carbon nanotubes of a narrowly-distributed diameter disposed within each of the plurality of nanochannels forming a carbon nanotube array that directly bridges said channel;
wherein each of the single-walled carbon nanotubes is electronically pure, has a single chirality structure, and is individually configured to align within one of the plurality of nanochannels;
washing the carbon nanotube array to remove unwanted carbon nanotubes;
depositing an interfacial conjugated electrolyte layer atop the carbon nanotube array; and
depositing a set of conductive source, drain and gate electrode layers atop the drain pre-pad, source pre-pad, and interfacial layer to electrically interconnect the electrodes and the carbon nanotube array.

17. The method of claim 16, further comprising purifying the pure single chirality single-walled carbon nanotubes by iterative gradient ultracentrifugation such that the carbon nanotubes have at least a 99% purity, a length of >1 μm, and a diameter of >0.7 nm with a distribution of diameters of ±0.1 nm.

18. The method of claim 16, wherein forming the carbon nanotube array further comprises:
depositing an ebeam resistant layer atop the dielectric layer;
forming a plurality of nanochannels in the ebeam resistant layer by e-beam etching;
functionalizing the channels with a poly(L-lysine) material;
washing the functionalized channels;
depositing a solution of the carbon nanotubes on the functionalized channels, wherein the solution is a mixture of carbon nanotubes dispersed by one or more surfactants;
baking the substrate;
washing the baked substrate to remove excess carbon nanotubes; and
removing the ebeam resistant material from the substrate.

19. The method of claim 18, wherein the surfactants are sodium cholate and sodium dodecyl sulfonate.

20. The method of claim 16, wherein the carbon nanotubes are arranged within the nanochannels such that there are no point crossings between the individual carbon nanotubes.

* * * * *